US010666875B2

(12) United States Patent
Suzuki et al.

(10) Patent No.: US 10,666,875 B2
(45) Date of Patent: May 26, 2020

(54) SOLID-STATE IMAGING DEVICE

(71) Applicant: PANASONIC INTELLECTUAL PROPERTY MANAGEMENT CO., LTD., Osaka (JP)

(72) Inventors: Sei Suzuki, Osaka (JP); Tohru Yamada, Kyoto (JP); Yasuyuki Shimizu, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 214 days.

(21) Appl. No.: 15/882,316

(22) Filed: Jan. 29, 2018

(65) Prior Publication Data
US 2018/0167562 A1   Jun. 14, 2018

Related U.S. Application Data

(63) Continuation of application No. PCT/JP2016/003493, filed on Jul. 28, 2016.

(30) Foreign Application Priority Data

Aug. 4, 2015   (JP) ................................. 2015-154552

(51) Int. Cl.
*H04N 5/243* (2006.01)
*H01L 27/146* (2006.01)
(Continued)

(52) U.S. Cl.
CPC ........... *H04N 5/243* (2013.01); *G01S 7/4863* (2013.01); *G01S 17/89* (2013.01); *H01L 27/146* (2013.01);
(Continued)

(58) Field of Classification Search
CPC ....... G01S 17/89; G01S 7/4816; G01S 7/4863; H01L 27/146; H01L 27/14607;
(Continued)

(56) References Cited

U.S. PATENT DOCUMENTS 8,179,463 B1 * 5/2012 Geurts ............... H04N 5/37452
348/296
8,570,412 B2 * 10/2013 Yanagita ........... H01L 27/14603
348/301
(Continued)

FOREIGN PATENT DOCUMENTS

JP   2004-294420 A   10/2004
JP   2010-213231 A    9/2010
(Continued)

OTHER PUBLICATIONS

P. Seitz Et Al., "The Lock-In CCD and the Convolver CCD—Applications of Exposure-Concurrent Photo-Charge Transfer in Optical Metrology and Machine Vision", SPIE, vol. 2415, pp. 276-284.*
(Continued)

*Primary Examiner* — Mohammed S Rahaman
(74) *Attorney, Agent, or Firm* — McDermott Will & Emery LLP

(57) ABSTRACT

A plurality of pixels of a solid-state imaging device include: a photoelectric converter which receives light from an object and converts the light into charge; a plurality of readers which read the charge from the photoelectric converter; a plurality of charge accumulators each of which accumulates the charge of the photoelectric converter read from the plurality of readers; and a transfer controller which performs a transfer control including controlling whether the charge accumulated in one of the plurality of charge accumulators is transferred or blocked from being transferred to another one of the plurality of charge accumulators. The transfer controller is disposed between the plurality of charge accumulators.

22 Claims, 24 Drawing Sheets

(51) Int. Cl.
*G01S 17/89* (2020.01)
*G01S 7/4863* (2020.01)
*H04N 5/378* (2011.01)
*G01S 7/481* (2006.01)
*H04N 5/33* (2006.01)

(52) U.S. Cl.
CPC .. *H01L 27/14607* (2013.01); *H01L 27/14623* (2013.01); *H01L 27/14636* (2013.01); *H01L 27/14645* (2013.01); *H01L 27/14649* (2013.01); *H04N 5/378* (2013.01); *G01S 7/4816* (2013.01); *H04N 5/332* (2013.01)

(58) Field of Classification Search
CPC ......... H01L 27/14623; H01L 27/14636; H01L 27/14645; H01L 27/14649; H04N 5/243; H04N 5/332; H04N 5/378
See application file for complete search history.

(56) References Cited

U.S. PATENT DOCUMENTS

| | | | | |
|---|---|---|---|---|
| 2006/0092304 A1* | 5/2006 | Hirota | ................... | H04N 5/343 348/311 |
| 2006/0192938 A1 | 8/2006 | Kawahito | | |
| 2009/0114919 A1* | 5/2009 | Kawahito | ................ | G01C 3/02 257/59 |
| 2010/0231774 A1 | 9/2010 | Tashiro | | |
| 2011/0261240 A1* | 10/2011 | Nohara | ............. | H01L 27/14812 348/300 |
| 2016/0119594 A1* | 4/2016 | Asano | ..................... | G01S 17/89 348/245 |

FOREIGN PATENT DOCUMENTS

| | | |
|---|---|---|
| WO | 2007/119626 A1 | 10/2007 |
| WO | 2015/011869 A1 | 1/2015 |

OTHER PUBLICATIONS

Extended European Search Report dated Jul. 20, 2018 for the corresponding European patent application No. 16832501.7.
P. Seitz Et Al., "The Lock-In CCD and the Convolver CCD—Applications of Exposure-Concurrent Photo-Charge Transfer in Optical Metrology and Machine Vision", SPIE, vol. 2415, pp. 276-284, XP000562977.
International Search Report and Written Opinion issued in International Patent Application No. PCT/JP2016/003493, dated Oct. 11, 2016; with partial English translation.

* cited by examiner

FIG. 10A

CHECKERED LAYOUT

| | | | |
|---|---|---|---|
| 50A → A0 A2 | A1 A3 | A0 A2 | A1 A3 |
| 50B → A1 A3 | A0 A2 | A1 A3 | A0 A2 |
| A0 A2 | A1 A3 | A0 A2 | A1 A3 |
| A1 A3 | A0 A2 | A1 A3 | A0 A2 |

FIG. 10B

STRIPE LAYOUT

| | | | |
|---|---|---|---|
| 50A → A0 A2 | A0 A2 | A0 A2 | A0 A2 |
| 50B → A1 A3 | A1 A3 | A1 A3 | A1 A3 |
| A0 A2 | A0 A2 | A0 A2 | A0 A2 |
| A1 A3 | A1 A3 | A1 A3 | A1 A3 |

FIG. 11A

CHECKERED LAYOUT

| A0 A2 | A1 A3 | A0 A2 | A1 A3 |
|---|---|---|---|
| A1 A3 | A0 A2 | A1 A3 | A0 A2 |
| A0 A2 | A1 A3 | A0 A2 | A1 A3 |
| A1 A3 | A0 A2 | A1 A3 | A0 A2 |

⌒⌒⌒ DISTANCE CALCULATION RANGE

● POSITION OF CENTER OF GRAVITY AFTER DISTANCE CALCULATION

FIG. 11B

STRIPE LAYOUT

| A0 A2 | A0 A2 | A0 A2 | A0 A2 |
|---|---|---|---|
| A1 A3 | A1 A3 | A1 A3 | A1 A3 |
| A0 A2 | A0 A2 | A0 A2 | A0 A2 |
| A1 A3 | A1 A3 | A1 A3 | A1 A3 |

⬭ DISTANCE CALCULATION RANGE

● POSITION OF CENTER OF GRAVITY AFTER DISTANCE CALCULATION

FIG. 12

| A0 A2 | A1 A3 | A0 A2 | A1 A3 |
|---|---|---|---|
| A1 A3 | A0 A2 | A1 A3 | A0 A2 |
| A0 A2 | A1 A3 | A0 A2 | A1 A3 |
| A1 A3 | A0 A2 | A1 A3 | A0 A2 |

⬭ FD SHARED RANGE

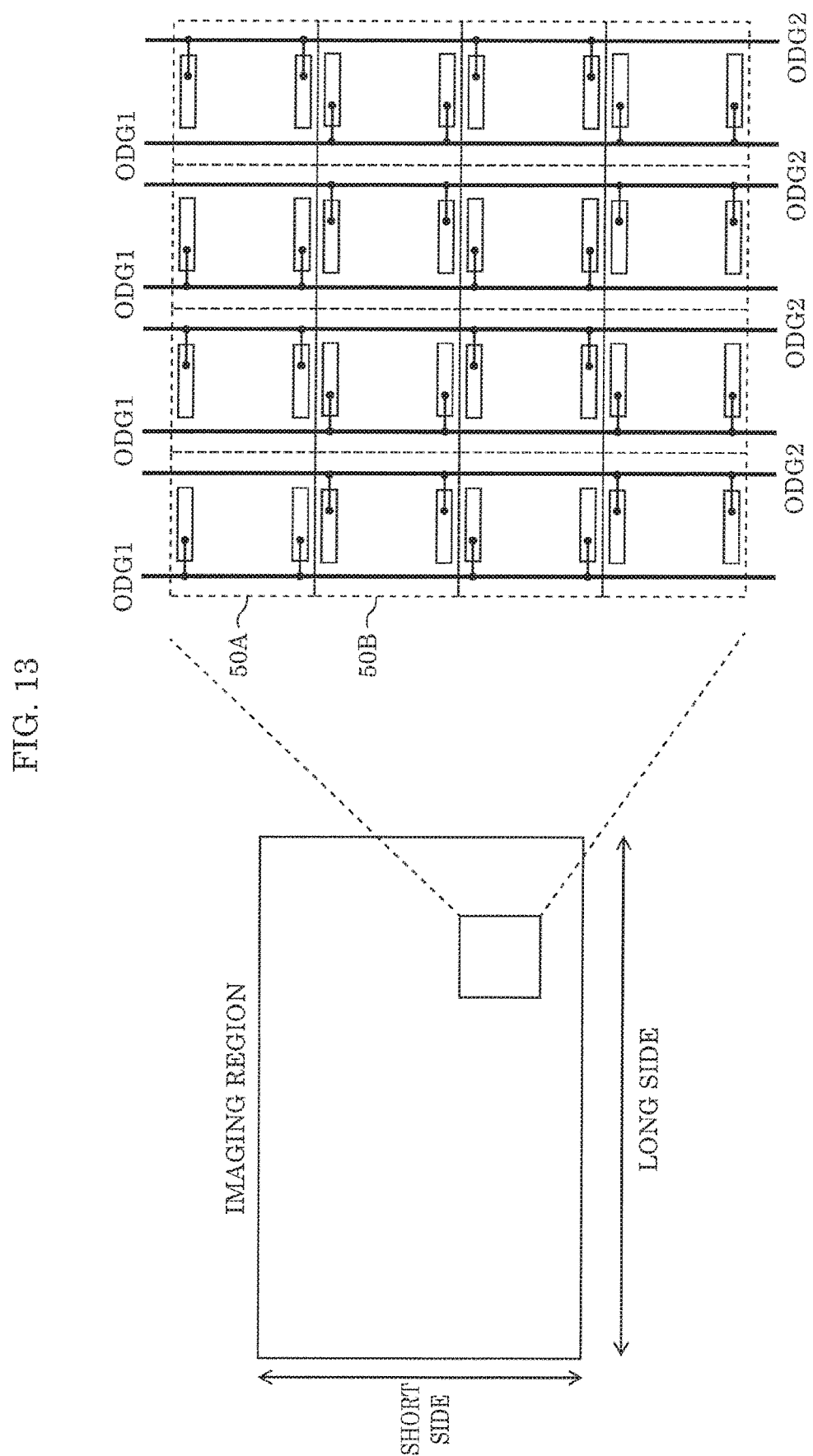

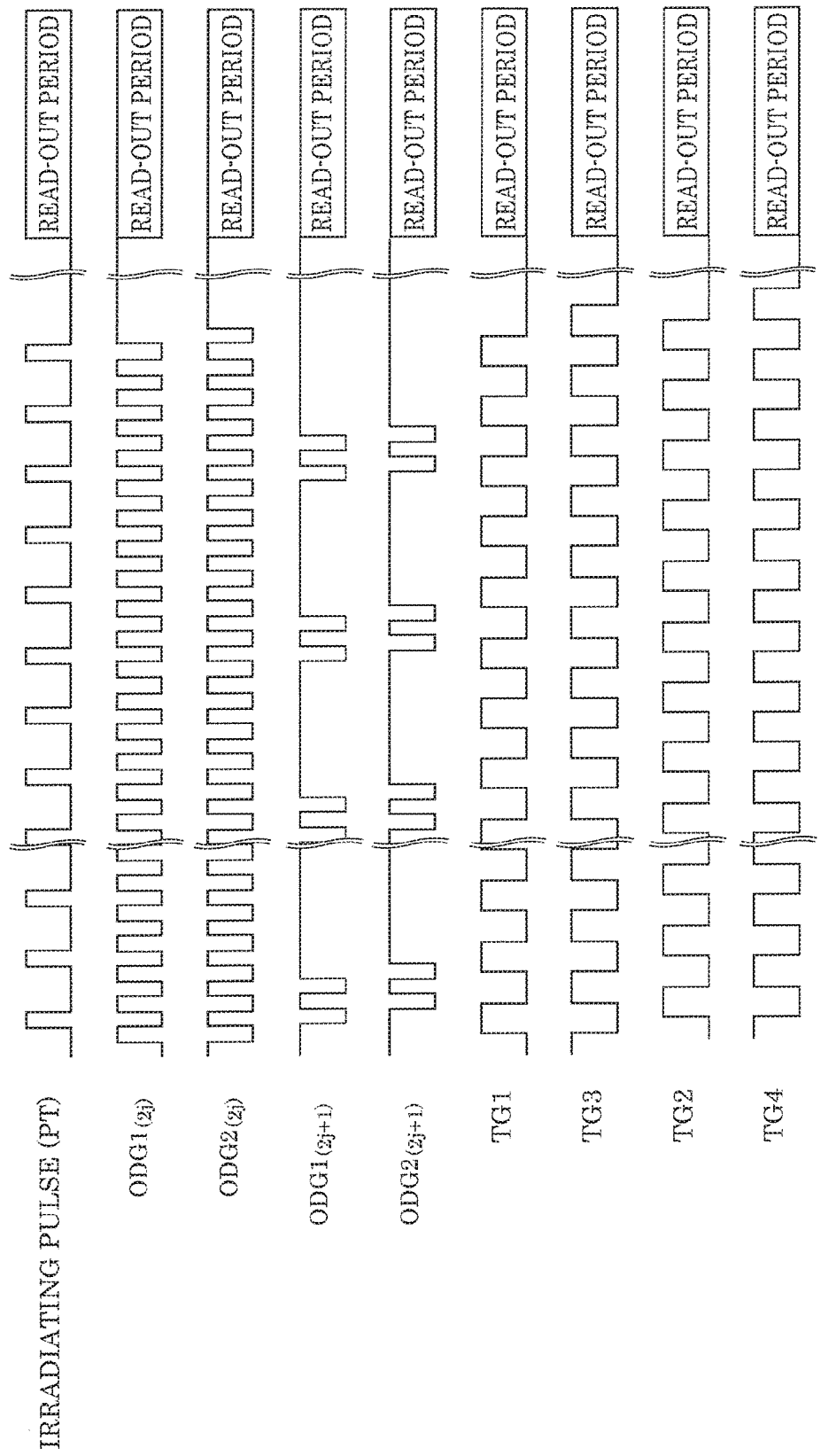

SOLID-STATE IMAGING DEVICE

CROSS REFERENCE TO RELATED APPLICATIONS

This application is a U.S. continuation application of PCT International Patent Application Number PCT/JP2016/003493 filed on Jul. 28, 2016, claiming the benefit of priority of Japanese Patent Application Number 2015-154552 filed on Aug. 4, 2015, the entire contents of which are hereby incorporated by reference.

BACKGROUND

1. Technical Field

The present disclosure relates to solid-state imaging devices to be used in imaging for distance measurement.

2. Description of the Related Art

Among methods for sensing an object, the time of flight (TOF) method is known in which a distance is measured using flight time that light takes to travel to and return from a measurement object.

Japanese Unexamined Patent Application Publication No. 2004-294420 (Patent Literature 1) discloses the related art in which two different signal storage units store signals obtained by transfer of charge with different phases in synchronization with intermittent behavior of light from a light source, the distance to an object is determined using the distribution ratio of the stored signals, and furthermore, a third signal storage unit stores signals of background light only, and thus background light removal is performed to eliminate the impact of the background light.

SUMMARY

In a general pulse TOF method, exposure periods T1 to T3 are set to have the same length as pulse width Tp where T1 is a first exposure period starting from time of a rising edge of irradiating light having pulse width Tp, T2 is a second exposure period starting from time of a falling edge of the irradiating light, and T3 is a third exposure period in which exposure is performed in a state where the irradiating light is OFF. Suppose that the amount of signals obtained by an imager during first exposure period T1 is denoted as A0, the amount of signals obtained by the imager during second exposure period T2 is denoted as A1, the amount of signals obtained by the imager during third exposure period T3 is denoted as A2, and the speed of light (299,792,458 m/s) is denoted as c, distance L is given by the following equation.

$$L = c \times Tp/2 \times \{(A1 \cdot A2)/(A0 \cdot A2 + A1 \cdot A2)\}$$

Here, A2 represents a signal that reflects background light obtained in the state where the irradiating light is OFF, and will be hereinafter referred to as BG.

The solid-state imaging device used in the distance measurement imaging device using this TOF method repeats, more than one time, sampling that is performed for one period of the irradiating light. In the abovementioned TOF method, distance measurement range D is represented as follows.

$$D = c \times Tp/2$$

Meanwhile, PTL 1 discloses broadly classified three methods in each of which an increase in the pulse width (Tp) of the light source leads to an increase in distance measurement range D, but causes a decrease in distance resolution. In other words, the distance measurement accuracy is inversely proportional to the pulse width (Tp) of the light source; there is the problem that when the pulse width of the light source is increased in order to widen the distance measurement range (limit) D, conversely, the distance measurement accuracy is decreased. Disclosed examples of a method for removing the background light include method (a) in which three charge accumulation nodes are used, method (b) in which two charge accumulation nodes are used so that two images, i.e., an image obtained when the irradiating light is ON and an image obtained when the irradiating light is OFF, are read and a difference therebetween is calculated, and method (c) in which an integrator and a voltage control pulse delay circuit are used. In (a), three charge accumulation nodes are necessary, and taking dark current into consideration, a charge-coupled device (CCD) memory is desired; in this case, the aperture ratio drops significantly. Furthermore, the exposure period is determined according to the TX width, and therefore, in the case where the pulse width of the light source is reduced, the TX width is reduced, and there is a need to increase three TX wiring widths for suppressing a pulse wiring delay; thus, there is the problem that sensitivity is reduced, for example, because mechanical vignetting of incident light due to wiring occurs. In (c), the circuitry is complex, and it is not possible to obtain a sufficient aperture ratio in this case either. Thus, there is the problem that miniaturization of pixels, that is, if the number of pixels is the same, downsizing, and if the optical size is the same, an increase in resolution, is difficult. Furthermore, (b) has the problem that the distance measurement accuracy is decreased because the background light is different between two images.

In view of the abovementioned problems, the present disclosure has an object to provide a solid-state imaging device which is small, has high distance measurement accuracy, and obtains a distance measurement signal that covers a wide distance measurement range.

In order to solve the abovementioned problems, a solid-state imaging device according to an aspect of the present disclosure includes a plurality of pixels arranged in a matrix on a semiconductor substrate, each of the plurality of pixels including: a photoelectric converter which receives light from an object and converts the light into charge; a plurality of readers which read the charge from the photoelectric converter; a plurality of charge accumulators each of which accumulates the charge of the photoelectric converter read by the plurality of readers; and a transfer controller which performs a transfer control including controlling whether the charge accumulated in one of the plurality of charge accumulators is transferred or blocked from being transferred to another one of the plurality of charge accumulators. The transfer controller is disposed between the plurality of charge accumulators.

According to the present disclosure, a small solid-state imaging device can obtain a distance measurement signal that covers a wide distance measurement range with high distance measurement accuracy.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 10A illustrates the layout of pixels arranged in a checkered pattern;

FIG. 10B illustrates the layout of pixels arranged in a stripe pattern;

FIG. 11A illustrates the center of gravity of distance data in the layout of pixels arranged in a checkered pattern;

FIG. 11B illustrates the center of gravity of distance data in the layout of pixels arranged in a stripe pattern;

FIG. 12 illustrates an FD shared layout in the layout of pixels arranged in a checkered pattern;

FIG. 13 is a configuration diagram of gate wires of an exposure controller according to Embodiment 1;

FIG. 15 is a timing chart illustrating a method for driving a solid-state imaging device according to Embodiment 2;

DETAILED DESCRIPTION OF THE EMBODIMENTS

Hereinafter, solid-state imaging devices and methods for driving the same according to the embodiments of the present disclosure will be described with reference to the drawings. Note that each of the following embodiments shows one specific example of the present disclosure; the numerical values, shapes, materials, structural elements, the arrangement and connection of the structural elements, etc., shown in the following embodiments are mere examples, and are not intended to limit the present disclosure.

Embodiment 1

[1-1. Configuration of Distance Measurement Imaging Device]

Figure 1:
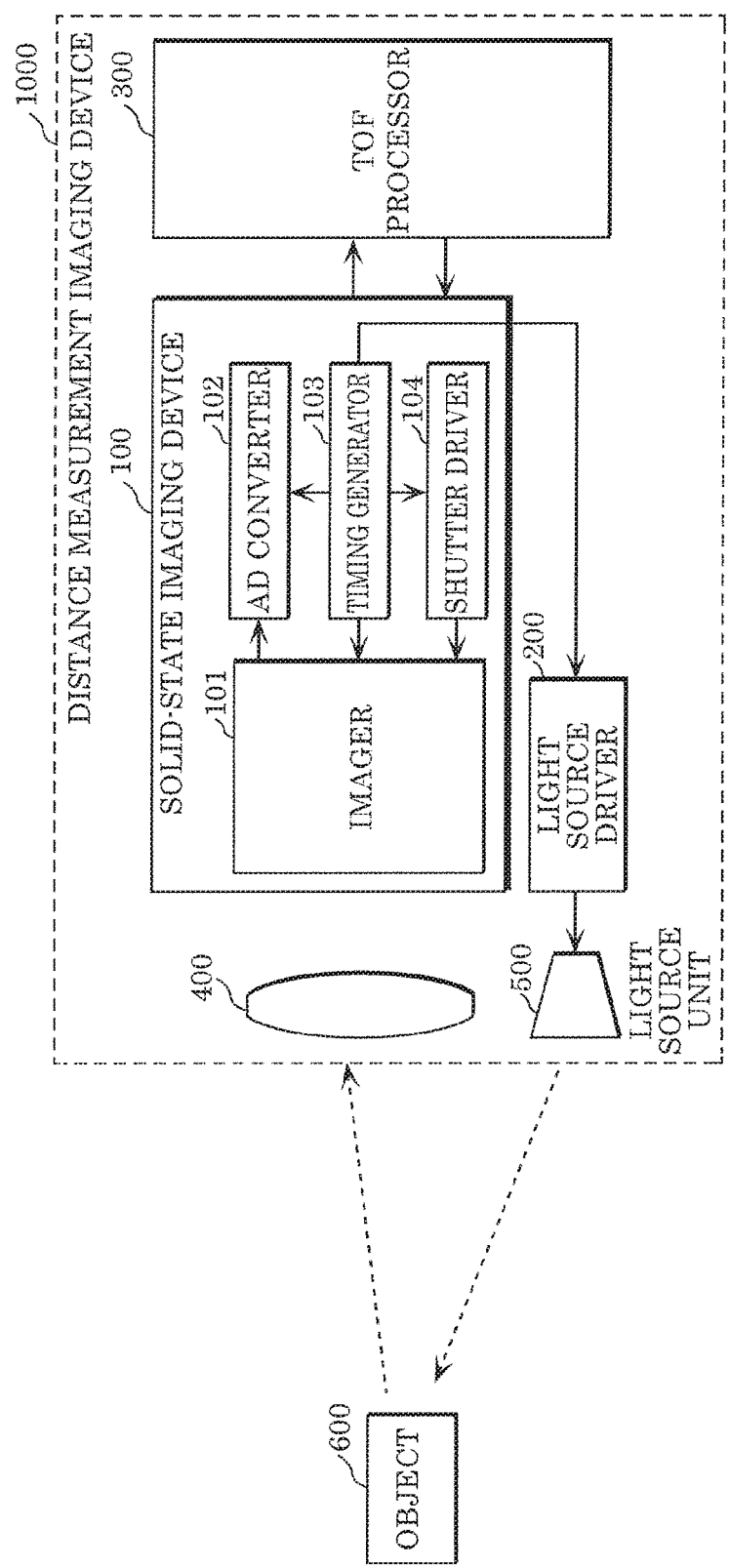
FIG. 1 is a function block diagram illustrating an example of an outline configuration of a distance measurement imaging device according to Embodiment 1.

FIG. 1 is a function block diagram illustrating an example of an outline configuration of distance measurement imaging device 1000 according to Embodiment 1. As illustrated in this figure, distance measurement imaging device 1000 includes solid-state imaging device 100, light source driver 200, TOF processor 300, optical lens 400, and light source unit 500. Solid-state imaging device 100 includes imager 101, AD converter 102, timing generator 103, and shutter driver 104.

Timing generator 103 generates a light emission signal instructing light irradiation to object 600 to drive light source unit 500 via light source driver 200, and generates an exposure signal instructing exposure to light reflected from object 600.

Imager 101 performs exposure on a region including object 600 plural times according to timing indicated by the exposure signal generated by timing generator 103, and obtains a signal corresponding to the total amount of the exposure performed plural times.

TOF processor 300 calculates the distance to object 600 on the basis of the signal received from solid-state imaging device 100.

As illustrated in FIG. 1, light source unit 500 emits near infrared light toward object 600 under background light. The light reflected from object 600 enters imager 101 through optical lens 400. The reflected light incident on imager 101 forms an image, and the formed image is converted into an electrical signal. The operations of light source unit 500 and solid-state imaging device 100 are controlled by timing generator 103 of solid-state imaging device 100. The output of solid-state imaging device 100 is converted into a distance image, and also into a visible image depending on the usage, by TOF processor 300. One example of solid-state imaging device 100 is what is called a complementary metal-oxide-semiconductor (CMOS) image sensor.

[1-2. Pixel Circuit Configuration

Figure 2:
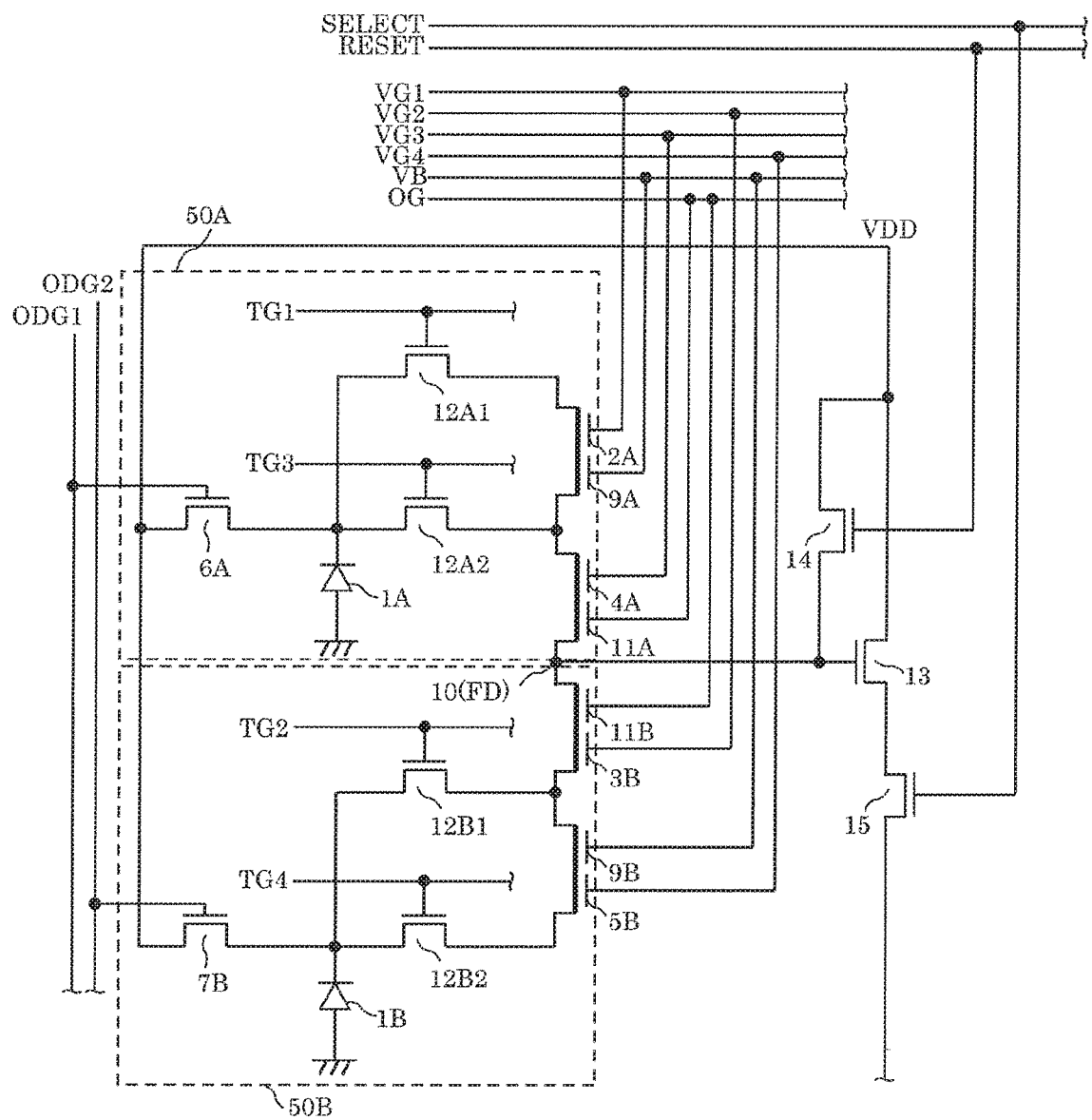
FIG. 2 illustrates a pixel circuit configuration of a distance measurement imaging device according to Embodiment 1.

FIG. 2 illustrates a pixel circuit configuration of distance measurement imaging device 1000 according to Embodiment 1. In this figure, the circuit configurations of pixel 50A and pixel 50B provided in an imaging region of imager 101 of solid-state imaging device 100 are illustrated. In the imaging region of imager 101, a plurality of sets of pixel 50A and pixel 50B are two-dimensionally arranged; among the plurality of pixels 50A and 50B arranged in the imaging region, one set of pixel 50A and pixel 50B is illustrated in in FIG. 2. Pixel 50A is a first pixel included in a first pixel group, and pixel 50B is a second pixel included in a second pixel group.

Pixel 50A includes photoelectric converter 1A, readers 12A1 and 12A2, charge accumulators 2A and 4A, transfer controller 9A, outputter 11A, and exposure controllers 6A. Pixel 50B includes photoelectric converter 1B, readers 12B1 and 12B2, charge accumulators 3B and 5B, transfer controller 9B, outputter 11B, and exposure controllers 7B. Furthermore, floating diffusion (FD) 10, amplification transistor 13, reset transistor 14 which resets FD 10, and selection transistor 15 are disposed in common to pixels 50A and 50B.

In the present embodiment, two pixels 50A and 50B adjacent to each other in the vertical direction share FD 10 and amplification transistor 13.

[1-3. Driving Method]

Next, a method for driving solid-state imaging device 100 according to the present embodiment for exposure will be described with reference to FIG. 2 and FIG. 3.

Figure 3:
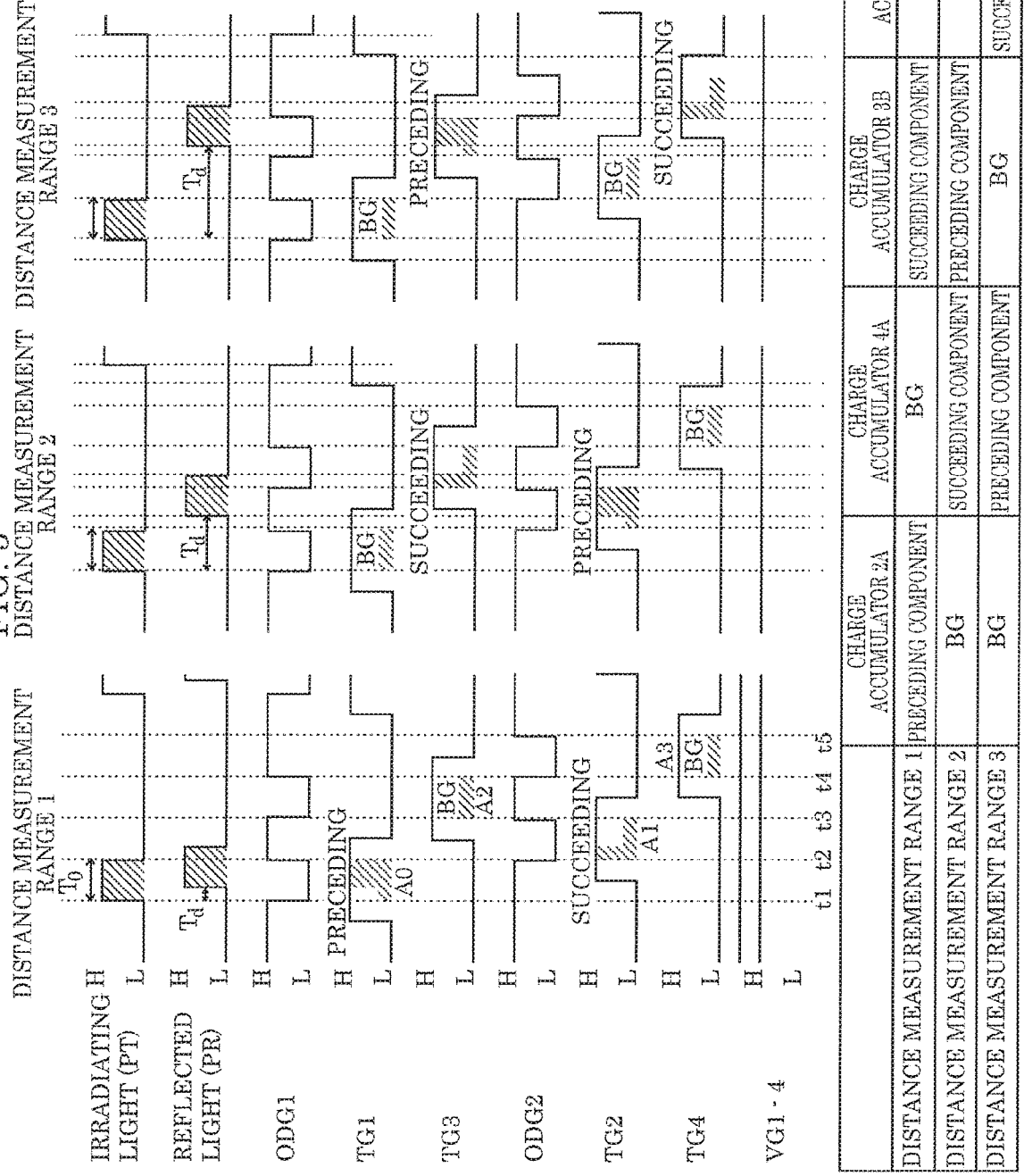
FIG. 3 is a drive timing chart illustrating operations of a solid-state imaging device according to Embodiment 1 during exposure.

FIG. 3 is a drive timing chart illustrating operations of solid-state imaging device 100 according to Embodiment 1 during exposure.

Drive pulse signals ODG1 and ODG2 are respectively applied to the gates of exposure controllers 6A and 7B in FIG. 2. Drive pulse signals TG1, TG3, TG2, and TG4 are applied to the gates of readers 12A1, 12A2, 12B1, and 12B2 in FIG. 2. Drive pulse signals VG1, VG3, VG2, and VG4 are applied to the gates of charge accumulators 2A, 4A, 3B, and 5B in FIG. 2.

Irradiating light (PT) that is repeatedly turned ON and OFF at a constant interval is repeatedly emitted from light source unit 500. In FIG. 3, T0 is the pulse width of irradiating light (PT) emitted from light source unit 500. Reflected light (PR) which is light reflected from object 600 reaches imager 101 with a delay of Td according to the distance from a light source and is converted into a signal charge in photoelectric converters 1A and 1B.

FIG. 3 includes distance measurement range 1, distance measurement range 2, and distance measurement range 3 which are classified by delay time Td of the reflected light (PR); distance measurement with Td having 0 to T0 is classified as distance measurement range 1, distance measurement with Td having T0 to 2T0 is classified as distance measurement range 2, and distance measurement with Td having 2T0 to 3T0 is classified as distance measurement range 3. All of time t1 to time t5 are arranged at the same time interval which is equal to irradiation pulse width T0.

First, distance measurement included in distance measurement range 1 will be described.

As an initial state, drive pulse signals ODG1 and ODG2 are in the high state, and charge generated in photoelectric converter 1A of pixel 50A and photoelectric converter 1B of pixel 50B is discharged to an overflow drain (VDD). Drive pulse signals TG1 to TG4 are in the low state. Drive pulse signals VG1 to VG4 are in the high state. Thus, charge accumulators 2A and 4A are electrically cut off from photoelectric converter 1A, and charge accumulators 3B and 5B are electrically cut off from photoelectric converter 1B. In this state, signal charge generated in photoelectric converters 1A and 1B is discharged to the overflow drain (VDD) via exposure controllers 6A and 7B, respectively, and is not accumulated in photoelectric converters 1A and 1B.

Next, in synchronization with time t1 at which the irradiating light (PT) is turned ON, drive pulse signal ODG1 switches to the low state, and the discharge of the charge from photoelectric converter 1A to the overflow drain (VDD) is stopped. At this time, drive pulse signal TG1 transitions from the low state to the high state earlier than drive pulse signal ODG1 by T0/2, and transfer of signal charge generated by entry of the reflected light (PR) containing the background light, to charge accumulator 2A via reader 12A1 (the first reader), is started.

Next, at time t2, drive pulse signal ODG1 switches to the high state, and the signal charge generated in photoelectric converter 1A is discharged to the overflow drain (VDD). With this operation, a preceding component (A0) of a reflected pulsed beam containing the background light is stored in charge accumulator 2A. At the same time, drive pulse signal ODG2 switches to the low state, and the discharge of the charge from photoelectric converter 1B to the overflow drain (VDD) is stopped. At this time, drive pulse signal TG2 transitions from the low state to the high state earlier than drive pulse signal ODG2 by T0/2, and transfer of signal charge generated by entry of the reflected light (PR) containing the background light, to charge accumulator 3B via reader 12B1 (the third reader), is started.

Next, at time t3, drive pulse signal ODG2 switches to the high state, and the signal charge generated in photoelectric converter 1B is discharged to the overflow drain (VDD). With this operation, a succeeding component (A1) of the reflected pulsed beam containing the background light is stored in charge accumulator 3B. At the same time, drive pulse signal ODG1 switches to the low state, and the discharge of the charge from photoelectric converter 1A to the overflow drain (VDD) is stopped. At this time, drive pulse signal TG3 transitions from the low state to the high state earlier than drive pulse signal ODG1 by T0/2, and transfer of signal charge generated by entry of the background light, to charge accumulator 4A via reader 12A2 (the second reader), is started.

Next, at time t4, drive pulse signal ODG1 switches to the high state, and the signal charge generated in photoelectric converter 1A is discharged to the overflow drain (VDD). With this operation, only a background light component (A2=BG) is stored in charge accumulator 4A. At the same time, drive pulse signal ODG2 switches to the low state, and the discharge of the charge from photoelectric converter 1B to the overflow drain (VDD) is stopped. At this time, drive pulse signal TG4 transitions from the low state to the high state earlier than drive pulse signal ODG2 by T0/2, and transfer of signal charge generated by entry of the background light, to charge accumulator 5B via reader 12B2 (the fourth reader), is started.

Lastly, at time t5, drive pulse signal ODG2 switches to the high state, and the signal charge generated in photoelectric converter 1B is discharged to the overflow drain (VDD). With this operation, only a background light component (A3=BG) is stored in charge accumulator 5B.

With the above-described operations, preceding component A0 of the reflected pulsed beam containing the background light is accumulated in charge accumulator 2A, background light component BG is accumulated in charge accumulator 4A, succeeding component A1 of the reflected pulsed beam containing the background light is accumulated in charge accumulator 3B, and background light component BG is accumulated in charge accumulator 5B.

Using these signals, delay amount Td (=T0×((A1−BG)/(A0+A1−2×BG))) of the reflected pulsed beam is determined. In distance measurement range 1, A0>A2 and A1>A3, and distance L to object 600 is calculated according to Equation 1 shown below. Note that in this case, BG which is an exposure amount of the background light may be any of A2, A3, and (A2+A3)/2.

[Math. 1]

$$L = \frac{c \cdot T_0}{2} \times \left( \frac{A1 - BG}{A0 - BG + A1 - BG} \right) \quad \text{(Equation 1)}$$

As described above, the start and the end of signal charge accumulation are determined only by drive pulse signals ODG1 and ODG2.

Note that in a general solid-state imaging device using the TOF principle, the timing of transition of drive pulse X for reading charge from the low level to the high level and the drive timing of transition of gate drive pulse Y at the overflow drain from the high level to the low level are the same. However, for example, even when the difference in delay between those is small at an end of the imaging region, there are cases where the starting position is determined by gate drive pulse Y and the ending position is determined by drive pulse X in the center portion of the imaging region; thus, in addition to the timing adjustment, a designed configuration for delay matching is needed.

In this regard, in distance measurement imaging device 1000 according to the present embodiment, the start and the end of signal charge accumulation are determined only by drive pulse signals ODG1 and ODG2, and therefore the delay time can be accurately adjusted.

Drive timing that is the same as or similar to that used for distance measurement range 1 is used for distance measurement range 2 and distance measurement range 3. Note that since the delay amount of the reflected light (PR) is different, a signal component held in each of the charge accumulators is different, which is specifically shown in the table in FIG. 3.

In distance measurement range 2, A2>A0 and A1>A3, and distance L is calculated according to Equation 2 shown below. Note that in this case, BG which is an exposure amount of the background light may be any of A0, A3, and (A0+A3)/2.

[Math. 2]

$$L = \frac{c \cdot T_0}{2} \times \left( \frac{A2 - BG}{A1 - BG + A2 - BG} \right) + \frac{c \cdot T_0}{2} \quad \text{(Equation 2)}$$

In distance measurement range 3, A2>A0 and A3>A1, and distance L is calculated according to Equation 3 shown below. Note that in this case, BG which is an exposure amount of the background light may be any of A0, A1, and (A0+A1)/2.

[Math. 3]

$$L = \frac{c \cdot T_0}{2} \times \left( \frac{A3 - BG}{A2 - BG + A3 - BG} \right) + 2 \times \frac{c \cdot T_0}{2} \quad \text{(Equation 3)}$$

In all the cases of distance measurement ranges 1 to 3 described above, it is possible to calculate the distance to object 600 by selecting an appropriate signal.

With the abovementioned configuration and distance measurement method for the distance measurement device, the distance measurement imaging device according to the present embodiment can expand the distance measurement range, which is $c \times T_0/2$ in a conventional distance measurement imaging device, to $3c \times T_0/2$ without reducing the distance measurement accuracy.

Next, the procedure for outputting a distance measurement signal accumulated in the charge accumulator will be described with reference to FIG. 4 and FIG. 5.

Figure 4:
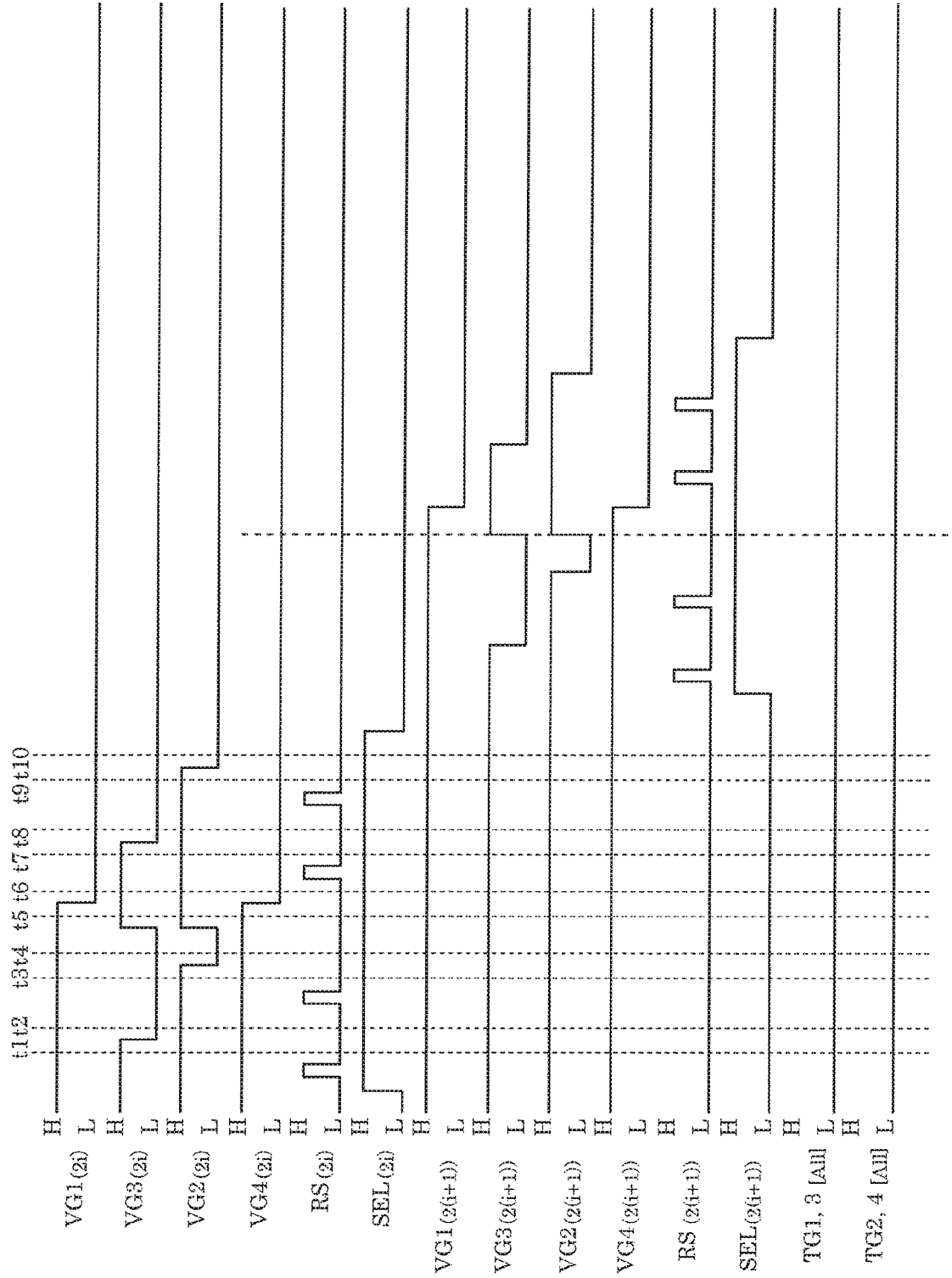
FIG. 4 is a timing chart illustrating distance measurement signal output timing of a solid-state imaging device according to Embodiment 1.

FIG. 4 is a timing chart illustrating distance measurement signal output timing of solid-state imaging device 100 according to Embodiment 1. In FIG. 4, with a configuration in which two pixels 50A and 50B adjacent in the vertical direction share FD 10, two rows including pixels 50A and 50B are denoted by suffix 2i, and two rows located immediately below said two rows are denoted by suffix 2(i+1). Here, i is a natural number. Specifically, the pixels denoted by suffix 2i represent two vertically adjacent pixels in the 2i-th an (2i+1)-th rows, and the pixels denoted by suffix 2(i+1) represent two vertically adjacent pixels in the (2i+2)-th and (2i+3)-th rows. Furthermore, in FIG. 4, RS represents a drive pulse signal that is applied to the gate of reset transistor 14, and SEL represents a drive pulse signal that is applied to the gate of selection transistor 15.

Figure 5:
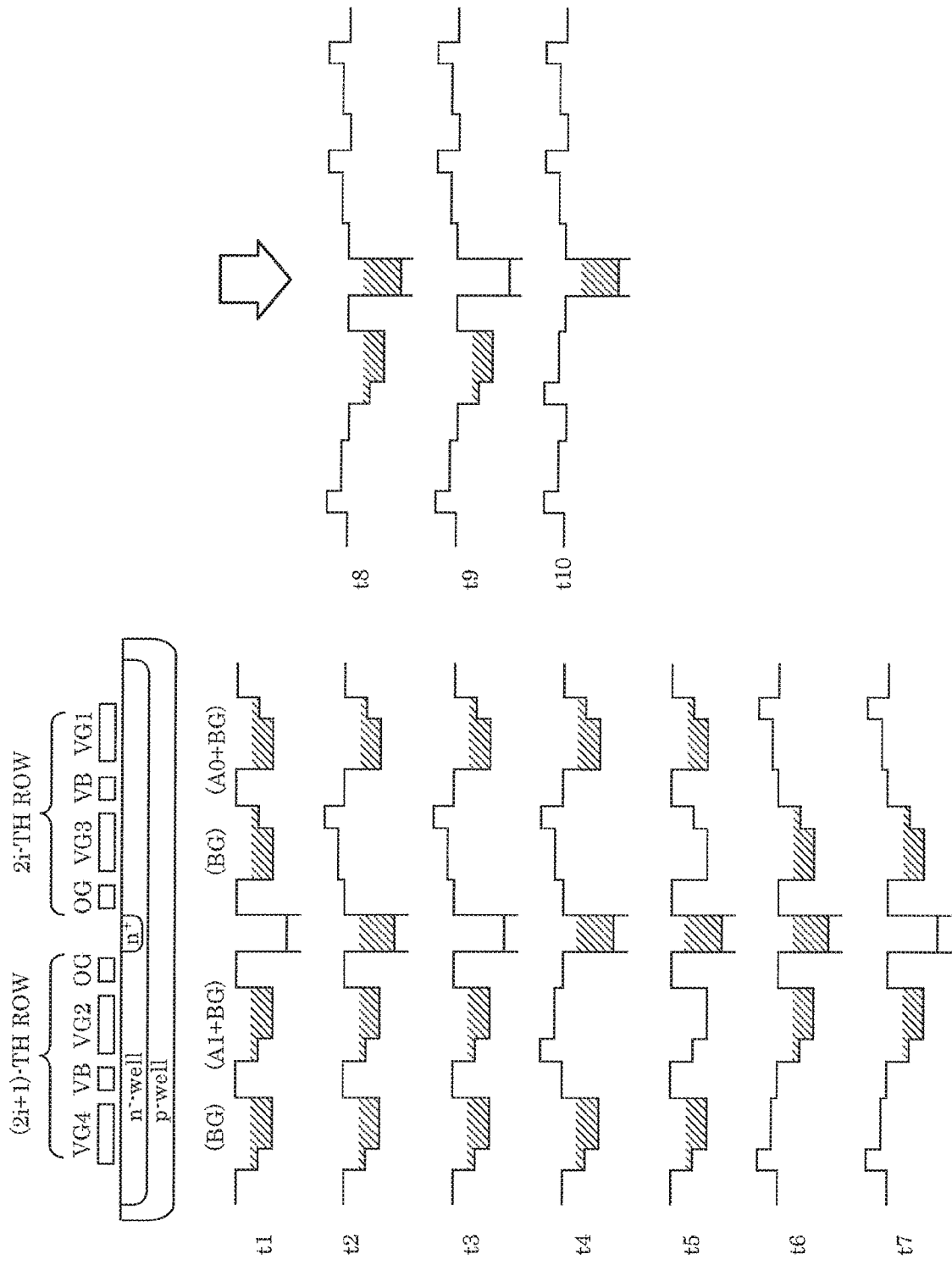
FIG. 5 is a potential diagram for an accumulator, a transfer controller, an outputter, and an FD in the 2i-th and (2i+1)-th rows.

FIG. 5 is a potential diagram for a charge accumulator, a transfer controller, an outputter, and an FD in the 2i-th and (2i+1)-th rows. Here, drive signal VB, which is applied to the gates of transfer controllers 9A and 9B, and drive signal OG, which is applied to the gates of outputters 11A and 11B, are each a signal having an appropriate direct-current potential and are set so that the charge accumulator in the high state serves as a potential barrier and the charge accumulator in the low state serves as a transfer channel. Furthermore, the charge accumulator includes a potential step for the purpose of facilitating charge transfer. This potential step can be formed by changing part of the impurity concentration of the charge accumulator.

First, in the state at time t1 which is the initial state, each of charge accumulators 2A, 4A, 3B, and 5B has a signal charge accumulated therein after an end of exposure operation. The description below assumes that in association with distance measurement range 1, the initial state is a state in which (A0+BG) is accumulated in charge accumulator 2A, (A1+BG) is accumulated in charge accumulator 3B, and BG is accumulated in charge accumulators 4A and 5B.

Next, time t2, drive pulse signal VG3 changes to the low state. Accordingly, signal charge BG held in charge accumulator 4A is transferred to FD 10 by drive signal OG. The signal charge is converted into a voltage in FD 10 and is read to the outside by a source follower circuit including amplification transistor 13 and selection transistor 15.

Next, time t3, drive pulse signal RS at the high level is input to reset transistor 14, and FD 10 is reset to a power supply potential.

Next, time t4, drive pulse signal VG2 changes to the low state. Accordingly, signal charge (A1+BG) held in charge accumulator 3B is transferred to FD 10 by drive signal OG. The output of the signal charge is as described earlier, and thus description thereof will be omitted here.

Next, time t5, drive pulse signals VG3 and VG2 change to the high state, and subsequently, drive pulse signals VG1 and VG4 change to the low state. Accordingly, signal charge (A0+BG) and BG held in charge accumulator 2A and charge accumulator 5B is transferred to charge accumulator 4A and charge accumulator 3B (time t6).

Furthermore, at time t7, FD 10 is reset, and then at time t8, drive pulse signal VG3 switches to the low state; thus, signal charge (A0+BG) is transferred to FD 10 and then is output as described earlier.

Next, at time t9, FD 10 is reset, and subsequently at time t10, drive pulse signal VG2 switches to the low state, resulting in output of signal charge BG.

With the above operations at time t1 to time t10, the output of the signal charge in the 2i-th row and the (2i+1)-th row is ended; subsequently, the abovementioned operations are sequentially performed on a 2-row basis so that the output of a frame is completed.

Note that as illustrated in FIG. 4, drive pulse signals VG1 and VG4 are the same in behavior. Therefore, the gate wires that transmit drive pulse signals VG1 and VG4 to the gates of charge accumulators 2A and 5B can be the same wire. Furthermore, transfer controllers 9A and) B to which drive signal VB is applied and outputters 11A and 11B to which drive signal OG is applied have the same role from the standpoint of barrier formation and transfer channel formation for the charge accumulators; thus, the gate wires that transmit drive signal VB and drive signal OG can also be the same wire.

Moreover, the potentials of these gates can be set to the same GND potential. In this case, the potentials under the gates of the transfer controller and the outputter need to be low so that the transfer is possible even when VG1, VG2, VG3, and VG4 are at the low level; thus, although the number of electrons that can be held in the charge accumulators becomes smaller than that in the above-described driving method, a booster circuit provided in the solid-state imaging device can be used to increase the high level for the charge accumulators so that the reduction in the number of electrons is suppressed.

With this, it is possible to reduce the number of wires in the pixels, and thus the sensitivity can be enhanced along with an increase in the aperture area to improve the distance measurement accuracy.

[1-4. Layout Configuration of Pixels]

Figure 6:
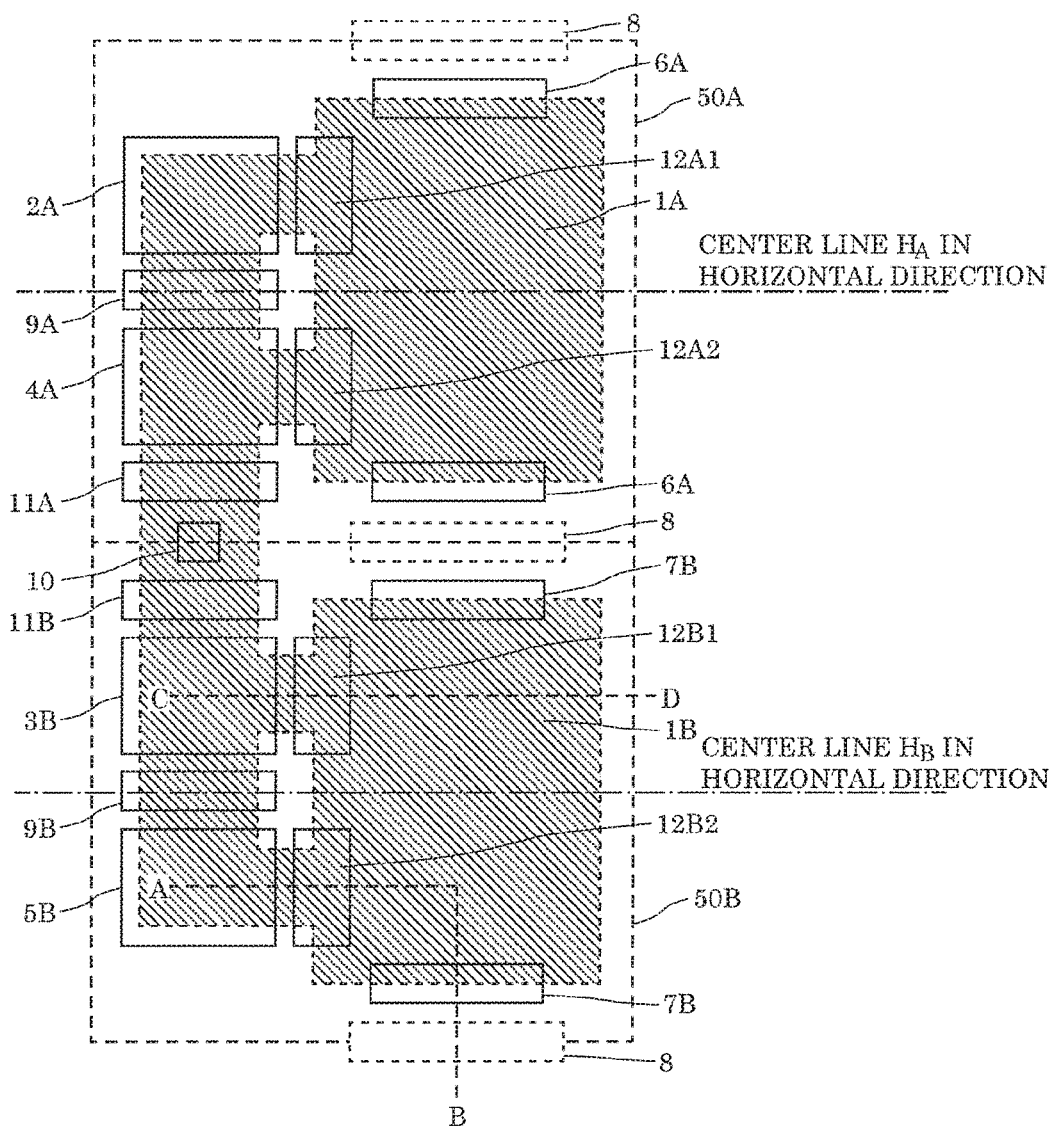
FIG. 6 is a schematic plan view illustrating a layout configuration of pixels of a solid-state imaging device according to Embodiment 1.

FIG. 6 is a schematic plan view illustrating a layout configuration of pixels of solid-state imaging device 100 according to Embodiment 1. The plurality of pixels of imager 101 are two-dimensionally arranged in the imaging region on a semiconductor substrate, and pixel 50A included in the first pixel group and pixel 50B included in the second pixel group form a single pixel unit that is the smallest unit of distance measurement. FIG. 6 illustrates the layout configuration of a single pixel unit including pixels 50A and 50B having the circuit configuration illustrated in FIG. 2.

As illustrated in FIG. 6, pixel 50A includes photoelectric converter 1A, readers 12A1 and 12A2, charge accumulators 2A and 4A, transfer controller 9A, outputter 11A, and exposure controllers 6A. Pixel 50B includes photoelectric converter 1B, readers 12B1 and 12B2, charge accumulators 3B and 5B, transfer controller 9B, outputter 11B, and exposure controllers 7B. Pixels 50A and 50B share FD 10 and overflow drain 8.

Photoelectric converters 1A and 1B receive light reflected from object 600 and accumulate signal charge generated by photoelectric conversion.

Charge accumulators 2A and 4A are respectively a first charge accumulator and a third charge accumulator which hold the signal charge accumulated in photoelectric converter 1A. Charge accumulators 2A and 4A are provided on an identical side of the outer edge of the region in which photoelectric converter 1A is formed. Charge accumulator 3B and 5B are respectively a second charge accumulator and a fourth charge accumulator which hold the signal charge accumulated in photoelectric converter 1B. Charge accumulators 3B and 5B are provided on an identical side of the outer edge of the region in which photoelectric converter 1B is formed.

Readers 12A1 and 12A2 are respectively readers which read the signal charge from photoelectric converter 1A to charge accumulators 2A and 4A. Readers 12B1 and 12B2 are respectively readers which read the signal charge from photoelectric converter 1B to charge accumulators 3B and 5B.

Transfer controller 9A is provided between charge accumulators 2A and 4A. Transfer controller 9B is provided between charge accumulators 3B and 5B.

Outputter 11A is provided adjacent to charge accumulator 4A which is one of the two charge accumulators in pixel 50A. Outputter 11B is provided adjacent to charge accumulator 3B which is one of the two charge accumulators in pixel 50B.

FD 10 is adjacent to charge accumulator 4A across outputter 11A and is adjacent to charge accumulator 3B across outputter 11B, and converts the signal charge into a voltage.

Exposure controllers 6A are provided on two sides of photoelectric converter 1A that are orthogonal to the side thereof on which charge accumulators 2A and 4A are provided. Exposure controllers 7B are provided on two sides of photoelectric converter 1B that are orthogonal to the side thereof on which charge accumulators 3B and 5B are provided.

Overflow drain 8 is provided adjacent to photoelectric converter 1A across exposure controller 6A or 7B and discharges, through exposure controller 6A or 7B, the signal charge accumulated in photoelectric converter 1A or 1B.

Charge accumulators 2A, 4A, 3B, and 5B, readers 12A1, 12A2, 12B1, and 12B2, transfer controllers 9A and 9B, and outputters 11A and 11B are each formed by stacking a gate insulating film and a gate electrode above the semiconductor substrate.

Note that overflow drain 8 is desirably shared by adjacent pixels.

FD 10 is connected to the source follower circuit, and amplifies and outputs a signal converted from a charge into a voltage; the configuration thereof is the same as or similar to a normal metal-oxide-semiconductor (MOS) image sensor, and thus description thereof will be omitted here.

The first pixel (pixel 50A) includes: a first reader and a second reader as the two readers; and a first exposure controller disposed on the same side as the first reader among the first reader and the second reader, and a second exposure controller disposed on the same side as the second reader among the first reader and the second reader, as the two exposure controllers, and the second pixel (pixel 50B) includes: a third reader and a fourth reader as the two readers; and a third exposure controller disposed on the same side as the third reader among the third reader and the fourth reader, and a fourth exposure controller disposed on the same side as the fourth reader among the third reader and the fourth reader, as the two exposure controllers.

The gate electrode of reader 12A1 and the gate electrode of reader 12A2 are axisymmetrically arranged and are disposed on the identical side of the outer edge of a light-receiving region of photoelectric converter 1A. More specifically, in the present embodiment, in a plan view of the semiconductor substrate, the gate electrode of reader 12A1 and the gate electrode of reader 12A2 are arranged symmetrically with respect to center line $H_A$ passing through the center of the light-receiving region of photoelectric converter 1A, and are disposed on the identical side of the outer edge of the light-receiving region. The two gate electrodes of exposure controllers 6A are axisymmetrically arranged and are disposed on two sides of the outer edge of the light-receiving region of photoelectric converter 1A that are orthogonal to said identical side thereof. The gate electrode of one (the first exposure controller) of exposure controllers 6A is disposed on the same side as reader 12A1 among reader 12A1 (the first reader) and reader 12A2 (the second reader), and the gate electrode of the other (the second exposure controller) of exposure controllers 6A is disposed on the same side as reader 12A2 among reader 12A1 and reader 12A2. More specifically, in the present embodiment, in the abovementioned plan view, the two gate electrodes of exposure controllers 6A are respectively disposed on two sides that are close to reader 12A1 and reader 12A2 and orthogonal to the abovementioned identical side, and are arranged symmetrically with respect to center line $H_A$.

The gate electrode of reader 12B1 and the gate electrode of reader 12B2 are axisymmetrically arranged and are disposed on the identical side of the outer edge of a light-receiving region of photoelectric converter 1B. More specifically, in the present embodiment, in the abovementioned plan view, the gate electrode of reader 12B1 and the gate electrode of reader 12B2 are arranged symmetrically with respect to center line $H_B$ passing through the center of the light-receiving region of photoelectric converter 1B, and are disposed on the identical side of the outer edge of the light-receiving region. The two gate electrodes of exposure controllers 7B are axisymmetrically arranged and are disposed on two sides of the outer edge of the light-receiving region of photoelectric converter 1B that are orthogonal to said identical side thereof. The gate electrode of one (the third exposure controller) of exposure controllers 7B is disposed on the same side as reader 12B1 among reader 12B1 (the third reader) and reader 12B2 (the fourth reader), and the gate electrode of the other (the fourth exposure controller) of exposure controllers 7B is disposed on the same side as reader 12B2 among reader 12B1 and reader 12B2. More specifically, in the present embodiment, in the abovementioned plan view, the two gate electrodes of exposure controllers 7B are respectively disposed on two sides that are close to reader 12B1 and reader 12B2 and orthogonal to the abovementioned identical side, and are arranged symmetrically with respect to center line $H_B$. The reason for this will be described below.

If the gate electrodes of the readers are not provided symmetrically, when leakage signals are generated due to background light or the like, the signals are not evenly distributed and are read at different rates. This leads to an error in the value obtained after subtraction of the background light in distance calculation, resulting in a decrease in the distance measurement accuracy. In order to inhibit this phenomenon, the gates of the readers are arranged symmetrically so that the amount of leakage signals due to background light or the like is equalized.

Figure 7:
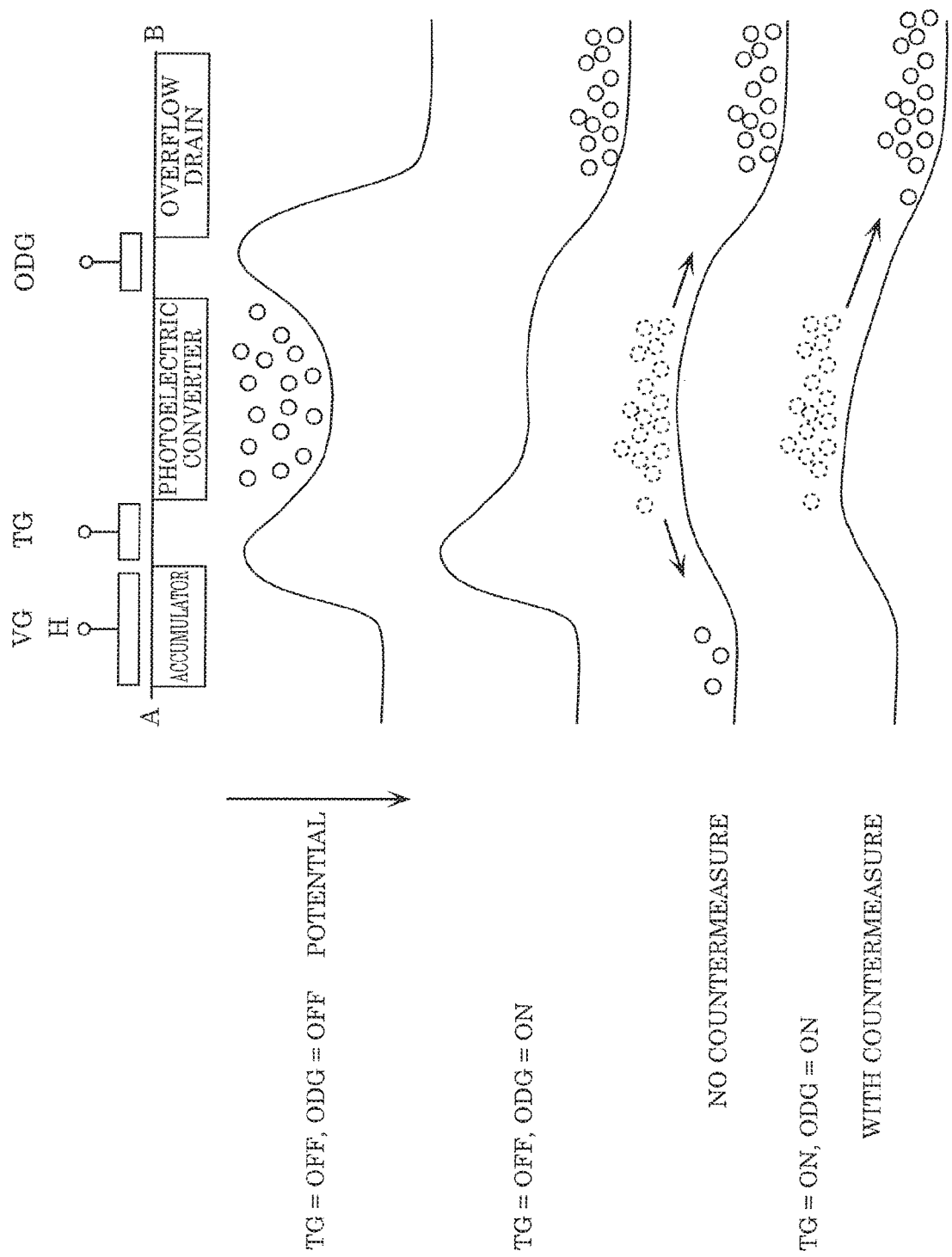
FIG. 7 illustrates a distribution of potentials in a photoelectric converter and surrounding parts thereof according to Embodiment 1.

FIG. 7 illustrates a distribution of potentials in the photoelectric converter and surrounding parts thereof according to Embodiment 1. FIG. 7 illustrates the distribution of potentials in the A-B cross-section in FIG. 6. In the present embodiment, when the gate of the exposure controller is in the high state (in FIG. 7, ODG=ON), the entire signal charge generated by light entry is desirably discharged to overflow drain 8. However, a small portion of the charge moves toward the gate of the reader under the influence of the potential distribution formed in the photoelectric conversion region. At this time, when the gate of the reader is in the high state (in FIG. 7, TG=ON and ODG=ON: no countermeasure), unnecessary charge leaks into the charge accumulator and is superimposed on principal signal charge, reducing the distance measurement accuracy.

Furthermore, when leakage signals are generated due to background light, a leakage component is superimposed on a background light signal, and thus the light resistance is reduced in a circumstance under high luminous background light. Note that even when there is a significant difference between leakage signals that are accumulated in different charge accumulators 2A and 4A via two readers 12A1 and 12A2, the distance measurement accuracy is reduced. The same applies to the case where there is a significant difference between leakage signals that are accumulated in different charge accumulators 3B and 5B via two readers 12B1 and 12B2.

In order to inhibit this phenomenon, the gate electrodes of readers 12A1 and 12A2 are arranged symmetrically with respect to center line $H_A$ of photoelectric converter 1A in the horizontal direction, and two gate electrodes of exposure controllers 6A are respectively provided close to the gate electrodes of readers 12A1 and 12A2.

With this, as illustrated in FIG. 7, it is possible to position, close to the reader, the vertex of the potential in the photoelectric converter when both the exposure controller and the reader are in the high state (in FIG. 7, TG=ON and ODG=ON: with countermeasure). Thus, the occurrence of unnecessary charge leaking into the charge accumulator can be reduced while the leakage components of charge moving toward the readers are equalized between the two readers located in the same pixel.

Furthermore, in order to obtain the same or similar advantageous effects, the potential under the gate of the exposure controller (drive pulse signal ODG) may be set lower than the potential under the gate of the reader (drive pulse signal TG).

Figure 8:
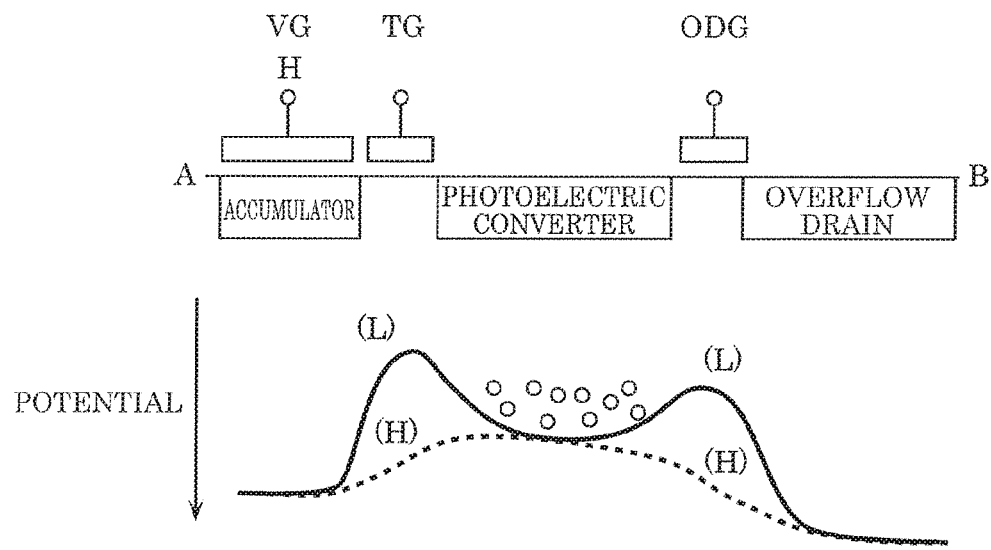
FIG. 8 illustrates a distribution of potentials in a photoelectric converter and surrounding parts thereof according to a variation of Embodiment 1.

FIG. 8 illustrates a distribution of potentials in a photoelectric converter and surrounding parts thereof according to a variation of Embodiment 1. With this, it is possible to position, close to the reader, the vertex of the potential in the photoelectric converter when both drive pulse signals TG and ODG are at the high level, and thus the same or similar advantageous effects can be obtained. Examples of a means for achieving this goal include a method of superimposing DC bias on drive pulse signal ODG, aside from a method of making the impurity concentration of the exposure controller different from the impurity concentration of the reader.

Furthermore, in the present embodiment, a potential gradient is formed in the horizontal direction in the photoelectric converter.

Figure 9:
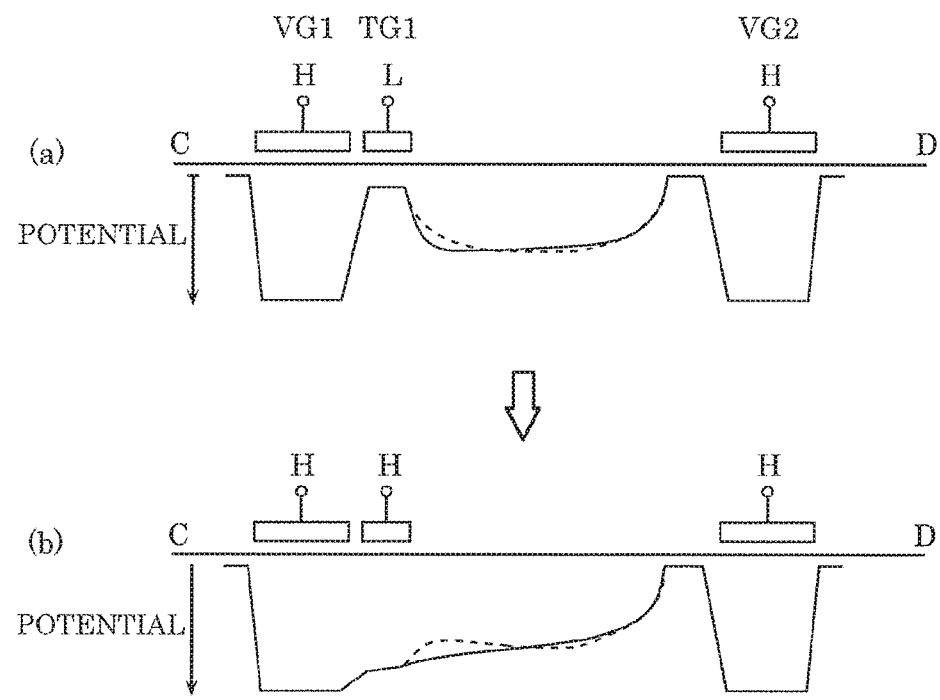
FIG. 9 illustrates a distribution of potentials in the horizontal direction in a photoelectric converter and surrounding parts thereof according to Embodiment 1.

FIG. 9 illustrates a distribution of potentials in the horizontal direction in the photoelectric converter and surrounding parts thereof according to Embodiment 1. FIG. 9 illustrates the distribution of potentials in the C-D cross-section in FIG. 6; the solid line represents the distribution of potentials in the present embodiment, and the dashed line represents the distribution of potentials in a conventional example. As illustrated in (a) in FIG. 9, in the present embodiment, when drive pulse signal TG is at the low level, the potential of the photoelectric converter has a gradient that makes a deep part near the gate electrode of the reader. With this, as illustrated in (b) in FIG. 9, when drive pulse signal TG switches to the high level, a smooth potential slope from the photoelectric converter to the charge accumulator is obtained so that charge in the photoelectric converter can be completely transferred for a short period of time. Thus, it is possible to improve the distance measurement accuracy of a solid-state imaging device for distance measurement that is required to completely transfer charge at high speed.

Next, the layout of a plurality of pixels will be described.

FIG. 10A illustrates the layout of pixels arranged in a checkered pattern, and FIG. 10B illustrates the layout of pixels arranged in a stripe pattern. As illustrated in FIG. 10A and FIG. 10B, pixel 50A (the first pixel) and pixel 50B (the second pixel) illustrated in FIG. 6 may be arranged in a checkered pattern or may be arranged in a stripe pattern.

FIG. 11A illustrates the center of gravity of distance data in the layout of pixels arranged in a checkered pattern, and FIG. 11B illustrates the center of gravity of distance data in the layout of pixels arranged in a stripe pattern. In FIG. 11A and FIG. 11B, as an example of calculation of distance data in the imaging region, the dashed line represents a range of calculation for signals for distance calculation that are output from the pixel unit made up of pixels 50A and 50B, and the black circle represents the center of gravity of distance data obtained by such calculation.

The stripe layout illustrated in FIG. 10B is useful in an application in which only the horizontal resolution is considered important, whereas the checkered layout illustrated in FIG. 10A is preferred when both the horizontal and vertical resolutions are required. Furthermore, as illustrated in FIG. 11A, in the case of the checkered layout, since the centers of gravity of the distance data after the distance calculation are located in a checkered pattern, the vertical and horizontal resolutions aligned in the checkered pattern are substantially equal to the case where distance data is present for each pixel.

Conventionally, four charge accumulators and four readers are needed in each pixel to obtain substantially the same distance range as that in the present embodiment in the case where the distance data is present for each pixel. Furthermore, since it is necessary to drive the four readers at high speed, the wiring width becomes large; thus, if this is implemented with the same pixel size, a decrease in the aperture ratio is a problem, and in order to attain high sensitivity while maintaining the aperture ratio, the pixel size needs to increase, meaning that downsizing is difficult to achieve. Furthermore, the size of the driver circuit also increases because of the large wiring width for meeting the need to drive the reader at high speed. Moreover, considering the aspect of a decrease in frame rate with twice as many signals for distance calculation, it can be said that the configuration in the present embodiment in which four signals for distance calculation are obtained by separate pixels 50A and 50B is very efficient.

Note that the method of sharing FD 10 in the case of the checkered layout (FIG. 10A) may be based on a sharing layout illustrated in FIG. 12, for example.

FIG. 12 illustrates an FD shared layout in the layout of the pixels arranged in the checkered pattern. As illustrated in this figure, when the FD shared layout is matched to the distance calculation range, the signals for distance calculation that are used in the distance data in the checkered pattern are output from the same FD amplifier. Therefore, the calculation can be performed without being affected by variations in sense capacitance between the pixels and variations in gain between amplifiers. Thus, it is possible to obtain high distance accuracy compared to the case where a distance is calculated using signals for distance calculation output from different FD amplifiers.

FIG. 13 a configuration diagram of the gate wires of the exposure controller in an example of the checkered layout according to Embodiment 1. Here, the illustrations of the configurations of pixels 50A and 50B are omitted in order to simplify the drawings. Drive pulse signals ODG1 and ODG2 are applied to the gate wires of the exposure controller, and therefore when there is a delay on the gate wires, the distance after calculation changes within an imaging surface, resulting in a decrease in accuracy. Furthermore, when the falling edges and the rising edges of drive pulse signals ODG1 and ODG2 are delayed, it is difficult to read the signal charge. Thus, the gate wires of the exposure controller are desirably arranged parallel to the short side of the imaging region and are further desirably supplied with the drive pulse signals from both ends of the gate wires.

Furthermore, in the present embodiment, DC bias may be superimposed on drive pulse signals ODG1 and ODG2 that are applied to the gate of the exposure controller which controls exposure time. This advantageous effect will be described below.

Figure 14A:
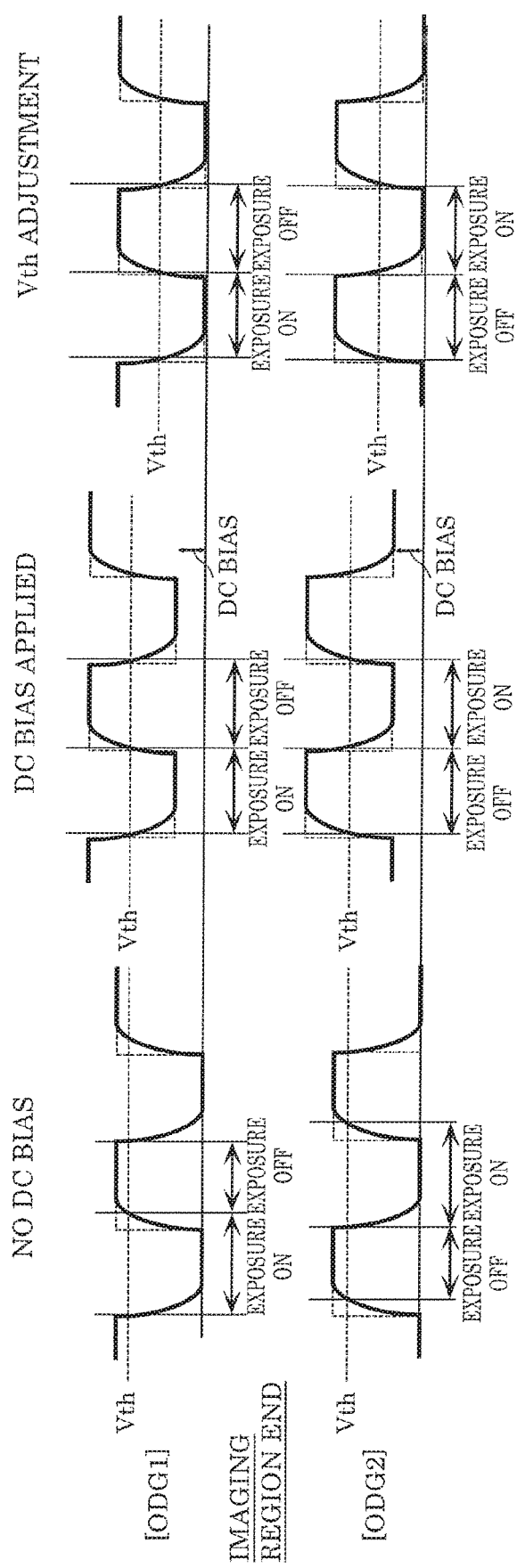
FIG. 14A illustrates a delay of an exposure control pulse at an end of an imaging region according to Embodiment 1.
Figure 14B:
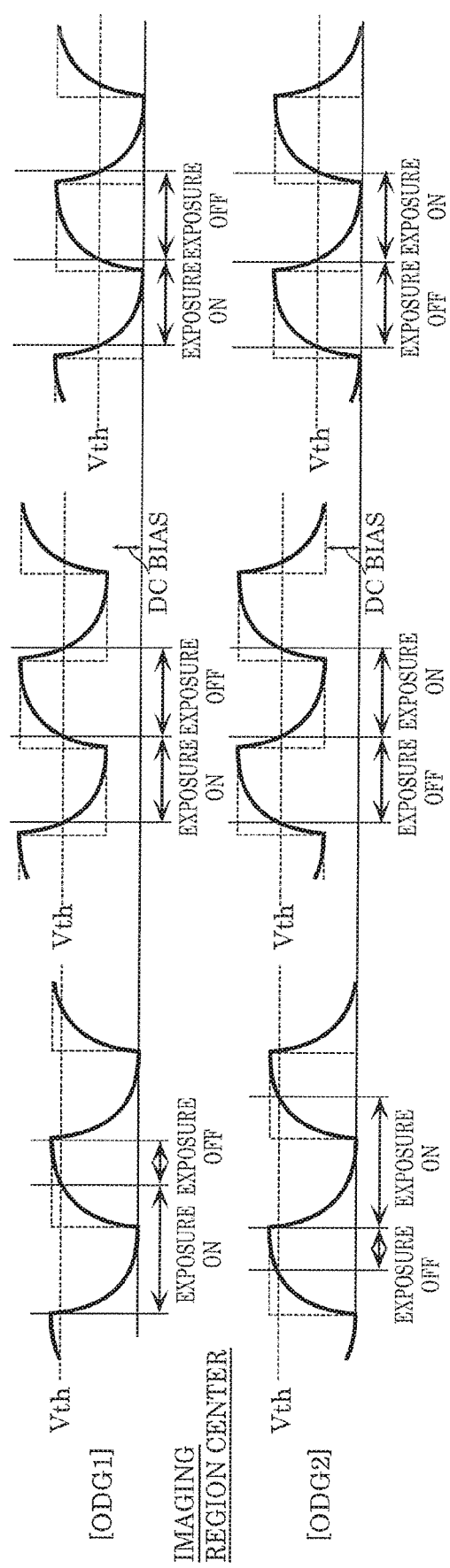
FIG. 14B illustrates a delay of an exposure control pulse at the center of an imaging region according to Embodiment 1.

FIG. 14A illustrates a delay of drive pulse signal ODG at an end of the imaging region according to Embodiment 1, and FIG. 14B illustrates a delay of drive pulse signal ODG at the center of the imaging region according to Embodiment 1.

The reset level of drive pulse signal ODG needs to be low in voltage because a power supply voltage is 2.8 V for mobile use, etc., but sometimes becomes close to the power supply voltage. Assuming that Vth is this reset level, as illustrated on the left side (no DC bias) in FIG. 14A and FIG. 14B, when Vth is high, there is a difference in duty between an exposure ON period and an exposure OFF period, and the roundness of the waveform causes a misalignment in duty between the end and the center of the imaging region. In this state, there is an overlap between two exposure OFF periods determined by two drive pulse signals ODG1 and ODG2, and thus the resultant value after the calculation is different between the center and the end even when the distance to the subject is the same. In order to make corrections, if one of the exposure pulses is delayed to avoid the overlap in the center portion, the exposure ON period is separated at the end, and thus the distance calculation cannot be performed at the end.

In contrast, as illustrated at the center (DC bias applied) in FIG. 14A and FIG. 14B, DC bias is applied to drive pulse signals ODG1 and ODG2 so that Vth is located at the amplification center of the pulse width. Accordingly, the duty can be 1:1 both at the end and at the center of the imaging region, and thus the in-plane distance measurement accuracy can be improved.

Note that as illustrated on the right side (Vth adjustment) in FIG. 14A and FIG. 14B, it is possible to obtain the same advantageous effects as the DC bias by making the impurity concentration of the exposure controller different from the impurity concentration of the reader so that the potential of the exposure controller becomes higher than the potential of the reader. In this case, Vth is desirably 50% of the amplitude of drive pulse signals ODG1 and ODG2.

As described in detail above, with the solid-state imaging device and the method for driving the same according to the present embodiment, it is possible to obtain a distance measurement signal that expands the distance measurement range and improves and stabilizes the distance measurement accuracy.

Embodiment 2

A solid-state imaging device and a method for driving the same according to Embodiment 2 will be described, focusing on differences from Embodiment 1.

Figure 16:
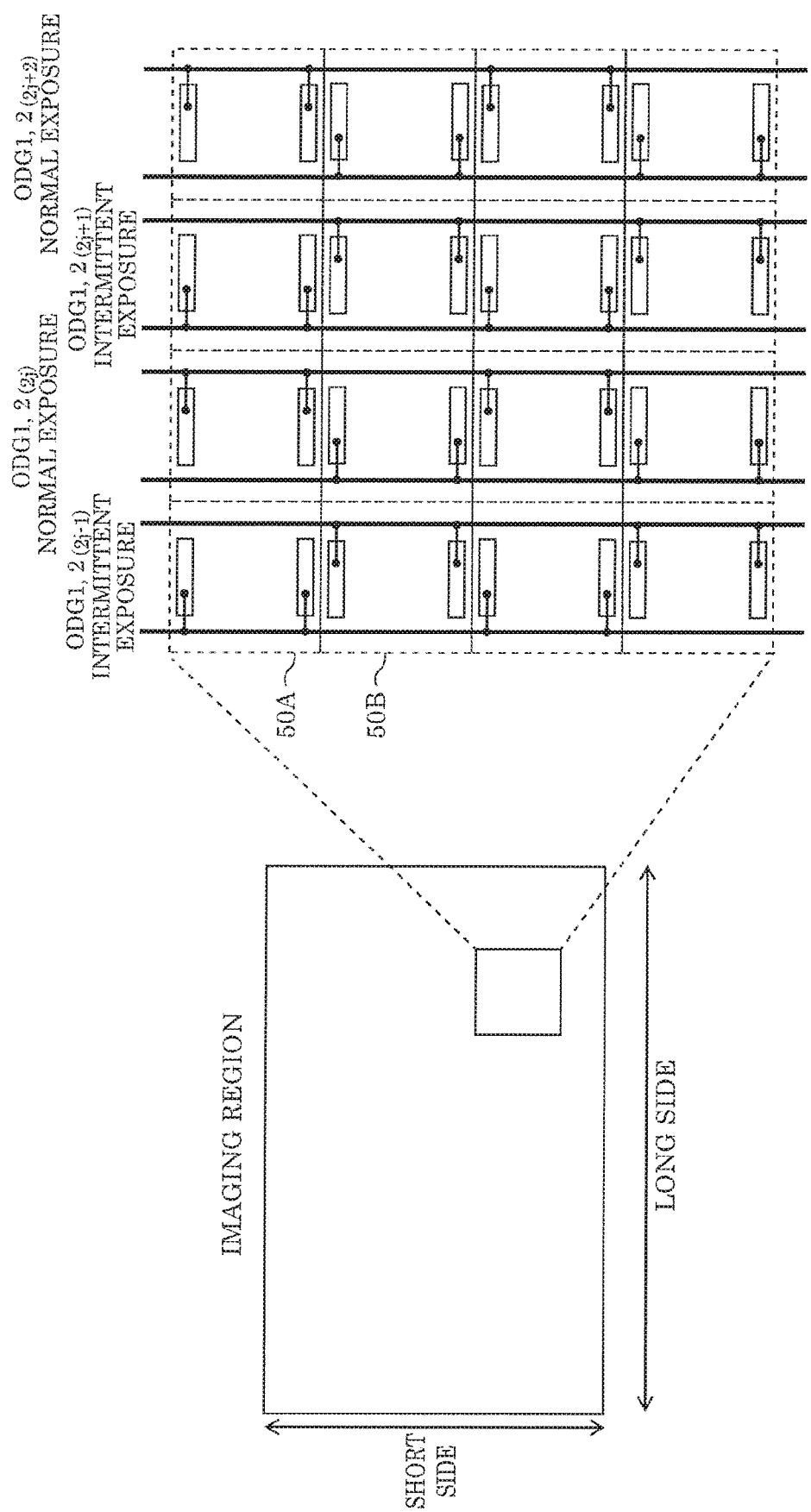
FIG. 16 is a schematic plan view of an imaging region for explaining that a different exposure control is performed for each pixel row in a solid-state imaging device according to Embodiment 2.

FIG. 15 is a timing chart illustrating a method for driving a solid-state imaging device according to Embodiment 2. FIG. 16 is a schematic plan view of the imaging region for explaining that a different exposure control is performed for each pixel row in the solid-state imaging device according to Embodiment 2.

In solid-state imaging device 100 according to Embodiment 1, only drive pulse signal ODG in the exposure controller is different between pixel 50A (the first pixel group) and pixel 50B (the second pixel group). The reflectance of object 600 has a large impact on a TOF distance measurement imaging device using near infrared light. When object 600 has low reflectance, the reflected light is weak, and therefore it is necessary to increase light source power or increase the length of the exposure period, but in the case where object 600 having high reflectance is also present on the subject, the charge accumulator which accumulates signals from object 600 having high reflectance is saturated, and thus the signals for distance calculation cannot be accurately calculated.

In this regard, in Embodiment 2, in order to cope with a wide range of the reflectance of objects 600, the number of times drive pulse signal ODG is applied to the gate of the exposure controller is changed for each column, and thus exposure control is performed in such a way that the charge accumulator is not saturated even when object 600 having high reflectance is present. Specifically, as illustrated in FIG. 15, the number of times of exposure is different between drive pulse signal ODG1 (2j) in the 2j-th row and drive pulse signal ODG1 (2j+1) in the 2j+1-th row, and the number of times of exposure is different between drive pulse signal ODG2 (2j) in the 2j-th row and drive pulse signal ODG2 (2j+1) in the 2j+1-th row. FIG. 16 illustrates the case where the exposure controllers are wired in the direction of the short side (in this figure, the vertical direction); in this case, the number of times of exposure is different on a per-column basis.

Figure 17:
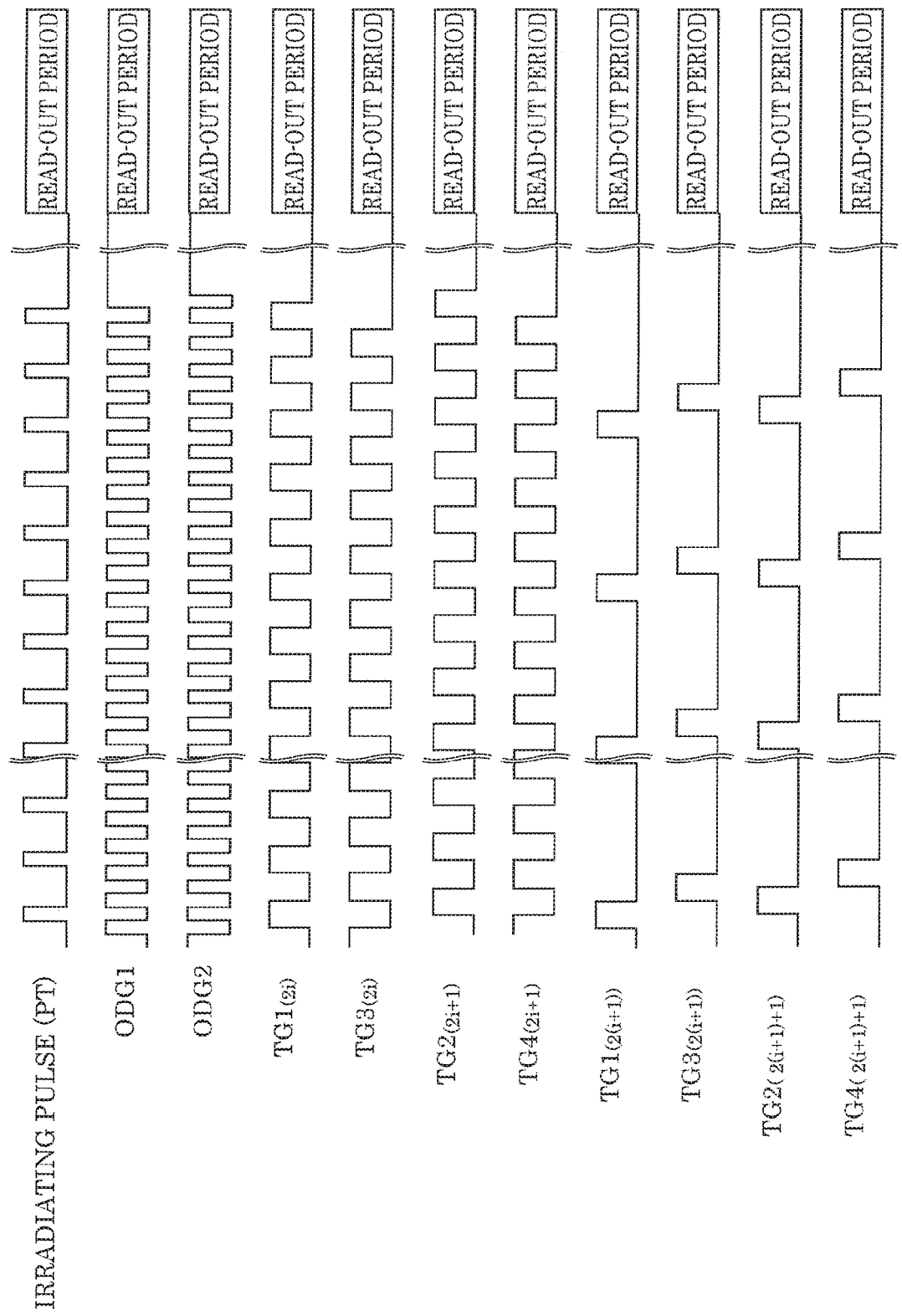
FIG. 17 is a timing chart illustrating a method for driving a solid-state imaging device according to a variation of Embodiment 2.

FIG. 17 is a timing chart illustrating a method for driving a solid-state imaging device according to a variation of Embodiment 2. Although the number of times of exposure for drive pulse signals OG1 and ODG2 is the same in the imaging region in the timing chart in FIG. 17, the number of times the readers read drive pulse signals TG1 to TG4 may be controlled. Note that in Embodiment 2, since the gate wires of the reader extend in the lateral direction, the amount of signals that are actually read to the charge accumulator can be adjusted on a per-row basis.

Note that as illustrated in FIG. 15 and FIG. 17, the exposure periods are partially removed desirably at equal intervals, throughout all the exposure periods, in a pixel row or column in which the number of times of exposure is small, compared to the case where the exposure is performed more on the first half of the exposure after the start, for example, because simultaneity can be maintained.

As described above, with the solid-state imaging device according to Embodiment 2, it is possible to accurately obtain a distance image even in a situation where objects 600 having significantly different levels of reflectance are present.

Embodiment 3

A solid-state imaging device and a method for driving the same according to Embodiment 3 will be described, focusing on differences from Embodiments 1 and 2.

Figure 18:
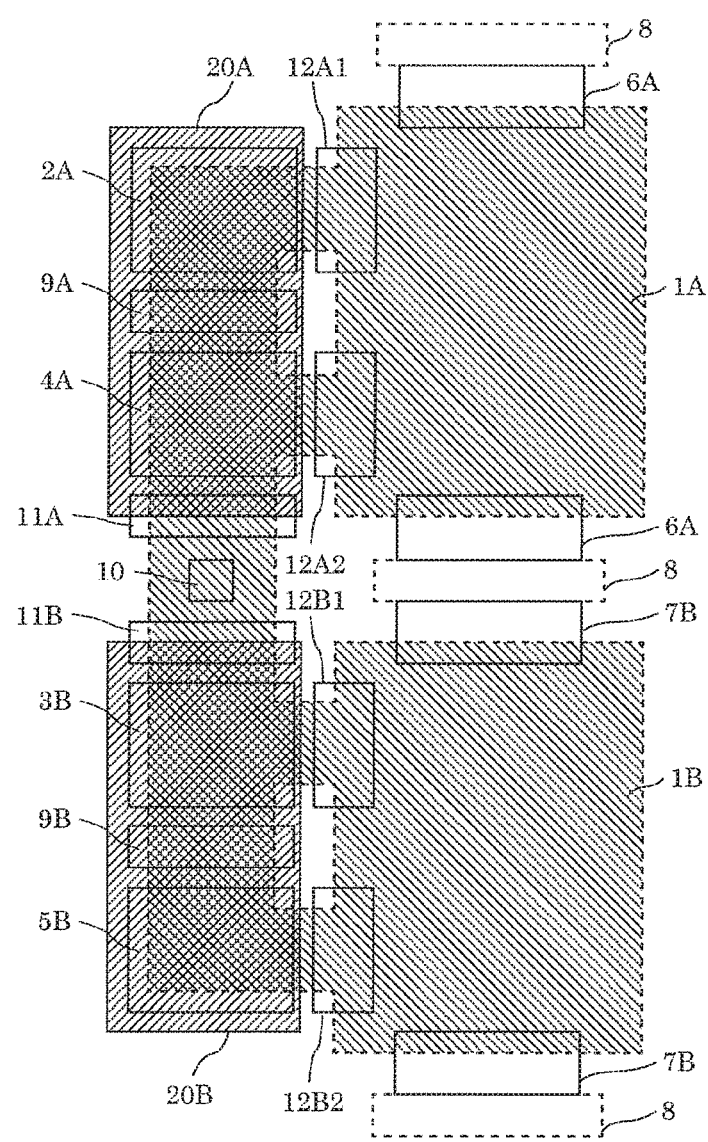
FIG. 18 is a schematic plan view illustrating a layout configuration of pixels of a solid-state imaging device according to Embodiment 3.

FIG. 18 is a schematic plan view illustrating a layout configuration of pixels of the solid-state imaging device according to Embodiment 3. The solid-state imaging device according to the present embodiment is different from solid-state imaging device 100 according to Embodiment 1 only in that light-shielding films 20A and 20B are formed in the imaging region. In the solid-state imaging device according to the present embodiment, light-shielding film 20A is provided so as to cover charge accumulators 2A and 4A and transfer controller 9A, and light-shielding film 20B is provided so as to cover charge accumulators 3B and 5B and transfer controller 9B.

With only a metal wiring layer as in a normal CMOS process, even when upper wiring shields light, oblique incident light enters the charge accumulator and is photoelectrically converted, reducing the light resistance or leading to an increase in the background light component; thus, the accuracy is reduced.

In order to address this problem, in the solid-state imaging device according to the present embodiment, light-shielding films 20A and 20B are disposed so as to cover the charge accumulator and the gate electrode of the transfer controller. Meanwhile, the light-shielding film is selectively not disposed on the gate electrode of the exposure controller. With this, it is possible to reduce the increase in the parasitic capacitance of the exposure controller which is required to be driven at high speed.

As described above, with the solid-state imaging device according to Embodiment 3, the light-shielding properties of the charge accumulator and the transfer controller improve, and thus the light resistance can be improved, and furthermore, the background light component is suppressed; thus, the distance accuracy can be improved.

Embodiment 4

A solid-state imaging device and a method for driving the same according to Embodiment 4 will be described, focusing on differences from Embodiments 1 to 3.

Figure 19:
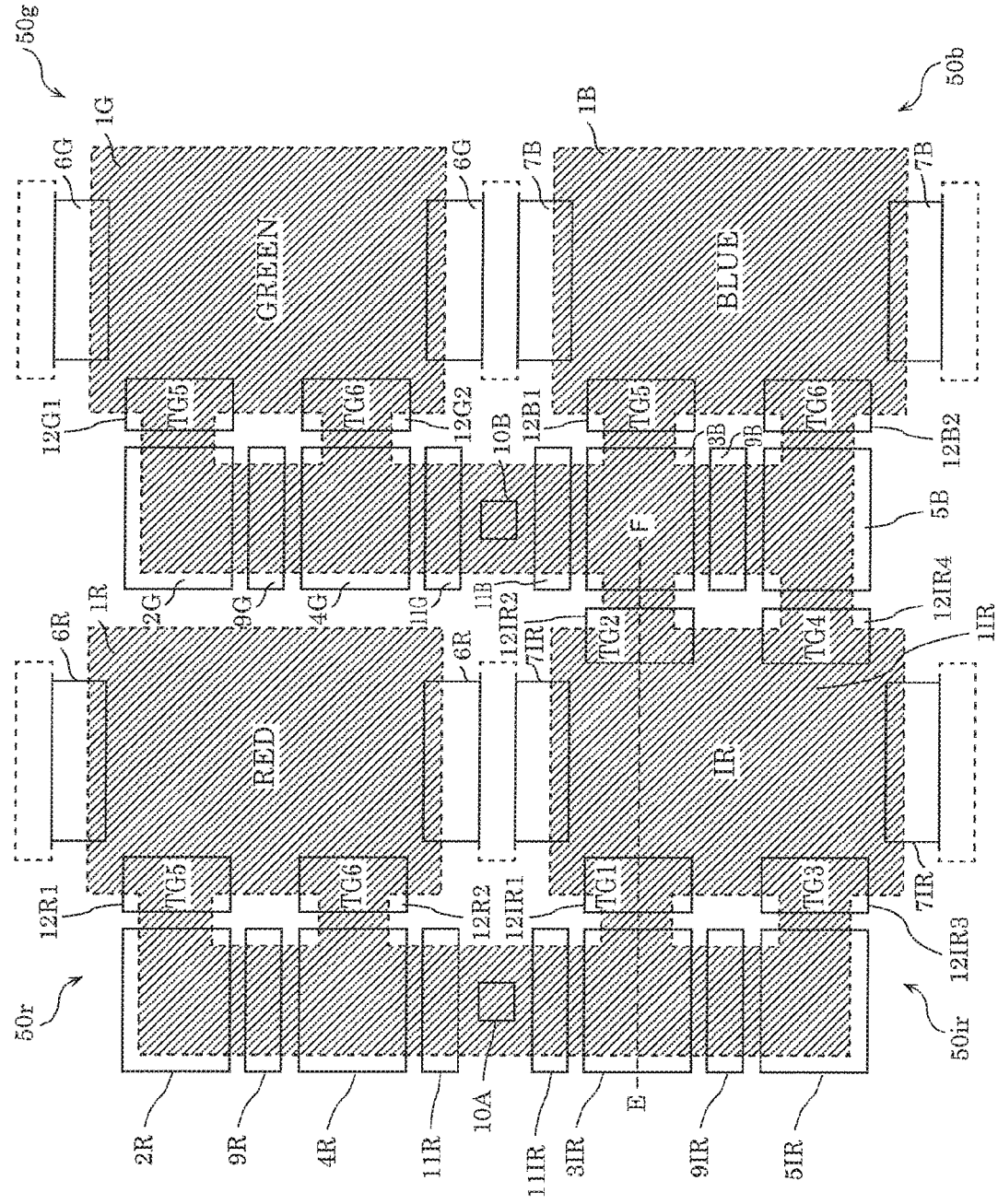
FIG. 19 is a schematic plan view illustrating a layout configuration of pixels of a solid-state imaging device according to Embodiment 4.
Figure 20:
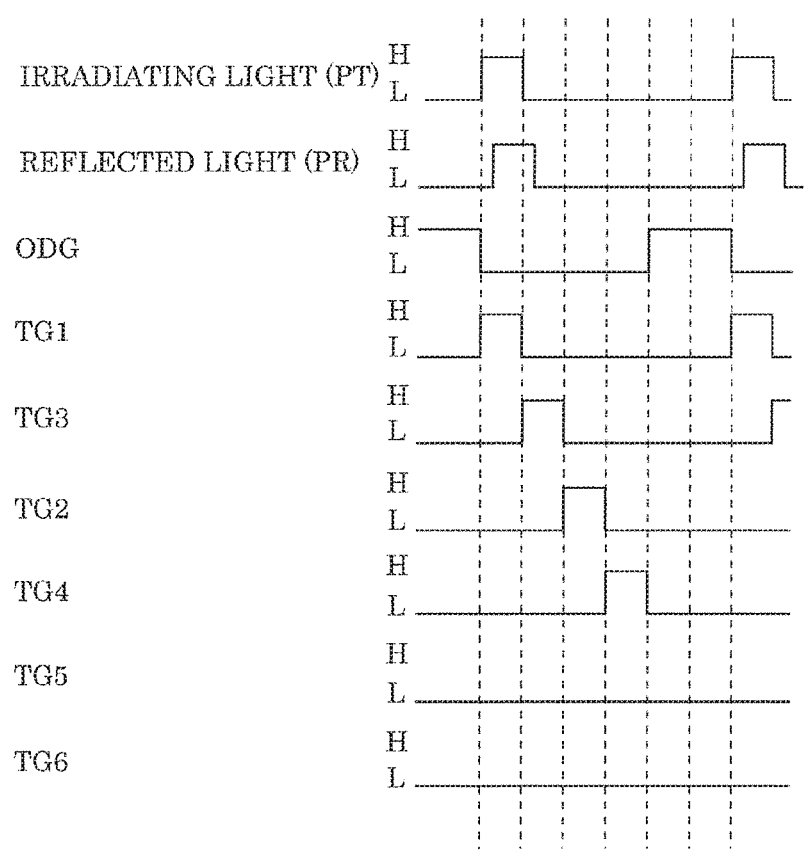
FIG. 20 is a drive timing chart illustrating operations of a solid-state imaging device according to Embodiment 4 during exposure.

FIG. 19 is a schematic plan view illustrating a layout configuration of pixels of the solid-state imaging device according to Embodiment 4, and FIG. 20 is a drive timing chart illustrating operations of the solid-state imaging device according to Embodiment 4 during exposure.

The solid-state imaging device according to the present embodiment includes a color filter, and as illustrated in FIG. 19, has an RGB-IR array to enable both color imaging and distance measurement using IR pixels. Unlike the solid-state imaging device 100 according to Embodiment 1, the solid-state imaging device according to the present embodiment obtains four signals for distance calculation by using readers 12IR1 to 12IR4 on both sides of photoelectric converter 1IR of a pixel 50*ir* for IR reception (a third pixel). It is advantageous that the four signals for distance calculation can be obtained by sequentially switching drive pulse signals TG1 to TG4 to the high level in one period of irradiating light (PT), as illustrated in FIG. 20. Furthermore, the number of light emission pulses can be reduced, and thus it is also advantageous that power consumption can be reduced. However, since the exposure is controlled by readers 12IR1 to 12IR4, there is a need for four fast drive pulse signals TG1 to TG4. Therefore, a large wiring width is required, and a driver included in the solid-state imaging device is large in scale.

Note that in the case where there is a large ODG delay within the imaging surface when ODG is switched from high to low in FIG. 20, there is a concern that the exposure period for a signal read by drive pulse signal TG1 becomes short, and therefore the timing for switching ODG from high to low may be set earlier than the timing for starting PT emission. Thus, the exposure periods for the signals read by TG1 to TG4 can be made uniform, but, a drawback is an increase in the background light component for only the signal read by TG1 at the edge of the imaging surface where there is little delay; in the present implementation, designing for suppressing delays is essential.

Figure 21:
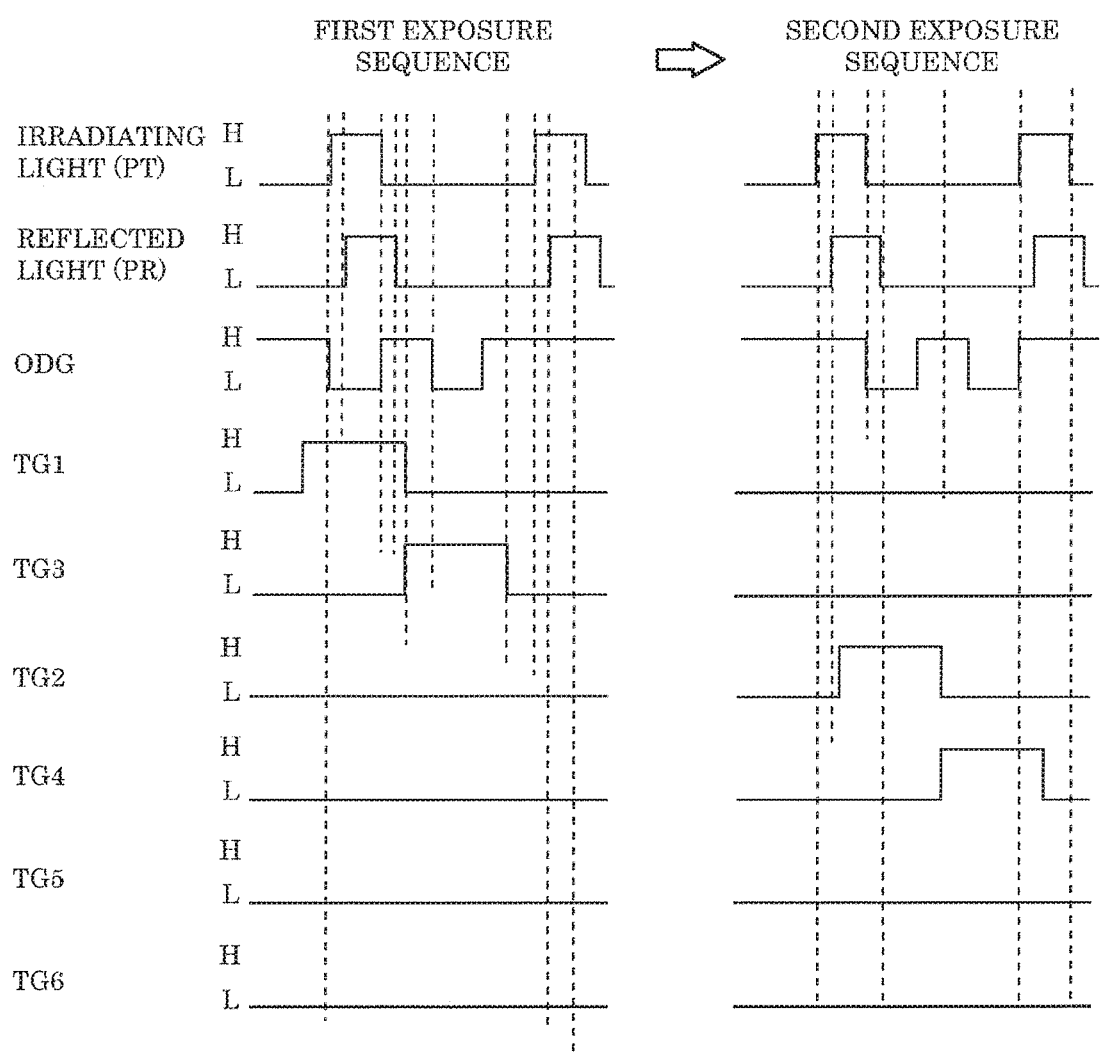
FIG. 21 is a drive timing chart illustrating operations of a distance measurement imaging device according to Variation 1 of Embodiment 4 during exposure.

FIG. 21 is a drive timing chart illustrating operations of a solid-state imaging device according to Variation 1 of Embodiment 4 during exposure. In a method for driving the solid-state imaging device according to the present variation, drive pulse signals TG1 and TG3 or drive pulse signals TG2 and TG4 are switched to the high level in one period of irradiating light (PT), and thus two signals for distance calculation are obtained. Readers 12IR1 to 12IR4 do not control exposure, but only read the signal controlled by drive pulse signal ODG in exposure controller 7IR. Note that the exposure sequence is divided into two while drive pulse signal ODG may be one. Specifically, in the first exposure sequence, a signal for distance calculation is read by drive pulse signals TG1 and TG3, and in the second exposure sequence, the exposure timing for drive pulse signal ODG is delayed by the pulse width of irradiating light (PT), and the signal for distance calculation is read by drive pulse signals TG2 and TG4 according to the charge accumulation state. A drive pulse signal having the same pulse width as an irradiating pulse is ODG only, and thus, compared to the embodiments illustrated in FIG. 19 and FIG. 20, the pulse width of TG1 to TG4 is twice, and since the TG pulse does not control the exposure, the allowable amount of delay is large. Therefore, it is advantageous that the wiring width for TG1 to TG4 can be small and the scale of the driver can also be small. At the time of reading of all pixels, signals are read using readers 12IR1, 12IR3, 12R1, 12R2, 121, 12G2, 12B1, and 12B2. Although the present structure uses two readers for obtaining two signals having different exposure periods in the reading of all the pixels, it is also possible to use a configuration in which the RGB pixels have readers 12R1, 12G1, and 12B1 only, in the case where only one signal is obtained.

Figure 22A:
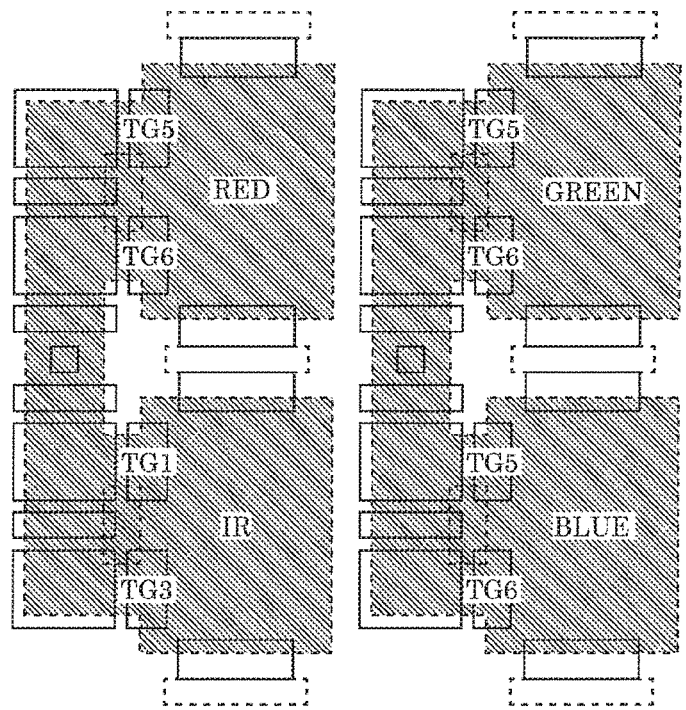
FIG. 22A is a schematic plan view illustrating a layout configuration of pixels of a solid-state imaging device according to Variation 2 of Embodiment 4.
Figure 22B:
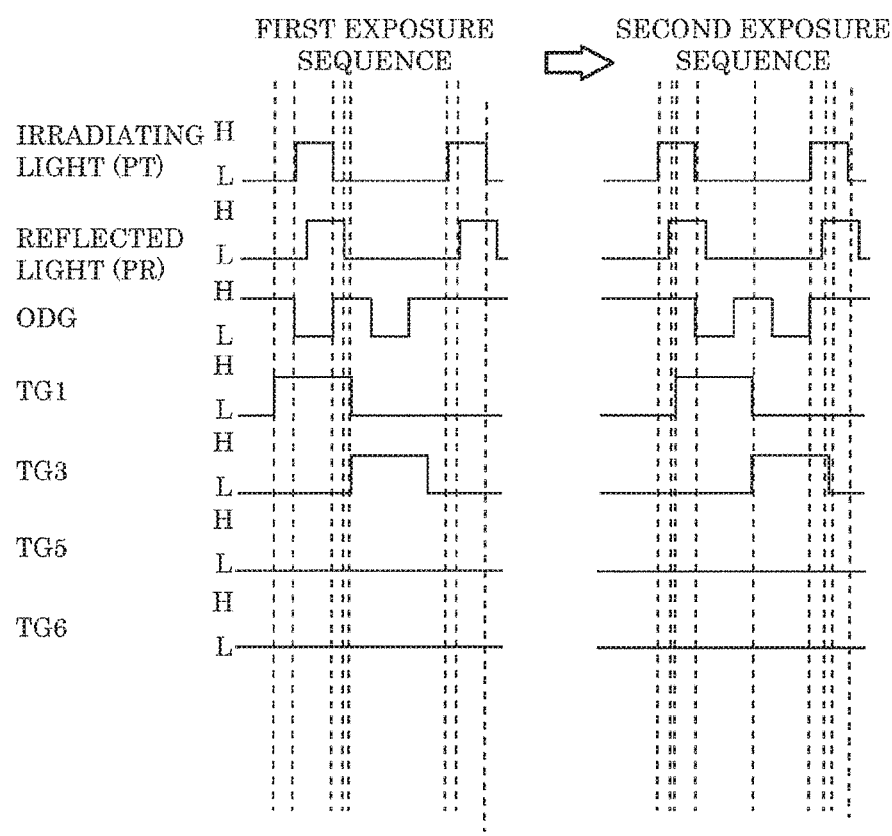
FIG. 22B is a drive timing chart illustrating operations of a solid-state imaging device according to Variation 2 of Embodiment 4 during exposure.

FIG. 22A is a schematic plan view illustrating a layout configuration of pixels of a solid-state imaging device according to Variation 2 of Embodiment 4, and FIG. 22B is a drive timing chart illustrating operations of the solid-state imaging device according to variation 2 of Embodiment 4 during exposure. With a configuration the same as or similar to the layout configuration of the pixels of the distance measurement imaging device according to Embodiment 1 such as that illustrated in FIG. 22A, A0 and A2 may be obtained in the first exposure sequence, and after one frame is read, A1 and A3 may be obtained in the second exposure sequence, as illustrated in FIG. 22B. In this case, it is advantageous that a reduced number of readers are required, but, since one frame read-out period is interposed between the first and second exposure sequences, an error may occur for object 600 that moves at high speed.

Figures 23, 24:
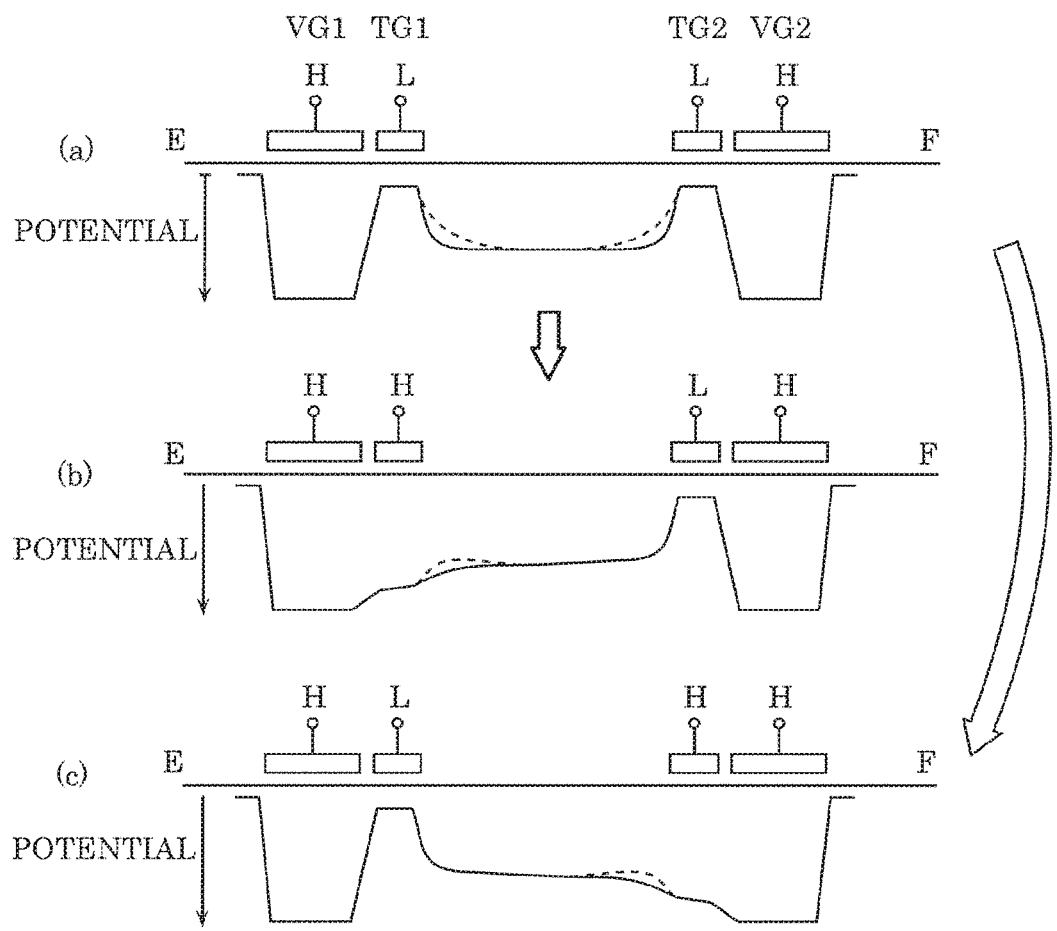
FIG. 23 illustrates a distribution of potentials in the horizontal direction in a photoelectric converter and surrounding parts thereof according to Embodiment 4.
FIG. 24 illustrates a variation of the layout of pixels of a solid-state imaging device according to Embodiment 4.

FIG. 23 illustrates a distribution of potentials in the horizontal direction in the photoelectric converter and surrounding parts thereof according to Embodiment 4. This does not apply to Variation 2 of Embodiment 4. FIG. 23 illustrates the distribution of potentials in the E-F cross-section in FIG. 19; the solid line represents the distribution of potentials in the present embodiment, and the dashed line represents the distribution of potentials in a conventional example. This is from that described in Embodiment 1 with reference to FIG. 9 in that, since the gate electrode of the reader is disposed on both sides of the photoelectric converter, the potential near the gate electrode on the both sides is flat so that charge can be transferred in both directions. With this, as illustrated in (b) in FIG. 23, when pulse signal TG1 switches to the high level, and as illustrated in (c) in FIG. 23, when drive pulse signal TG2 switches to the high level, a smooth potential slope from the photoelectric converter to the charge accumulator is obtained so that charge in the photoelectric converter can be completely transferred for a short period of time. Thus, it is possible to improve the distance measurement accuracy of a solid-state imaging device for distance measurement that is required to completely transfer charge at high speed.

Note that in the present embodiment, FD 10A is shared by two pixels 50r (a fifth pixel) and 50ir (the third pixel) and FD 10B is shared by two pixels 50g (a sixth pixel) and 50b (a fourth pixel), but one FD may be shared by these four pixels. In this case, the number of charge accumulators to which different drive pulse signals are applied increases by two, but it is possible to improve the distance measurement accuracy because there is no variation in sense capacitance.

FIG. 24 illustrates a variation of the layout of pixels of the solid-state imaging device according to Embodiment 4. The arrangement configuration of a pixel circuit according to the present embodiment can be applied to a 4×4 RGB-IR array such as that illustrated in this figure. When such a 4×4 RGB-IR array is used, the IR pixels are arranged in a checkered pattern, and thus it is advantageous that the resolution in both the horizontal direction and the vertical direction is twice as high as that of a 2×2 array such as that illustrated in FIG. 19.

As described above, with the solid-state imaging device according to Embodiment 4, the TOF operation using four charge accumulators is possible even in the RGB-IR array, and thus both the distance measurement range and the distance measurement accuracy can be sufficient, and it is possible to obtain an RGB-IR image as well.

Embodiment 5

A solid-state imaging device and a method for driving the same according to Embodiment 5 will be described, focusing on differences from Embodiments 1 to 4.

Figure 25:
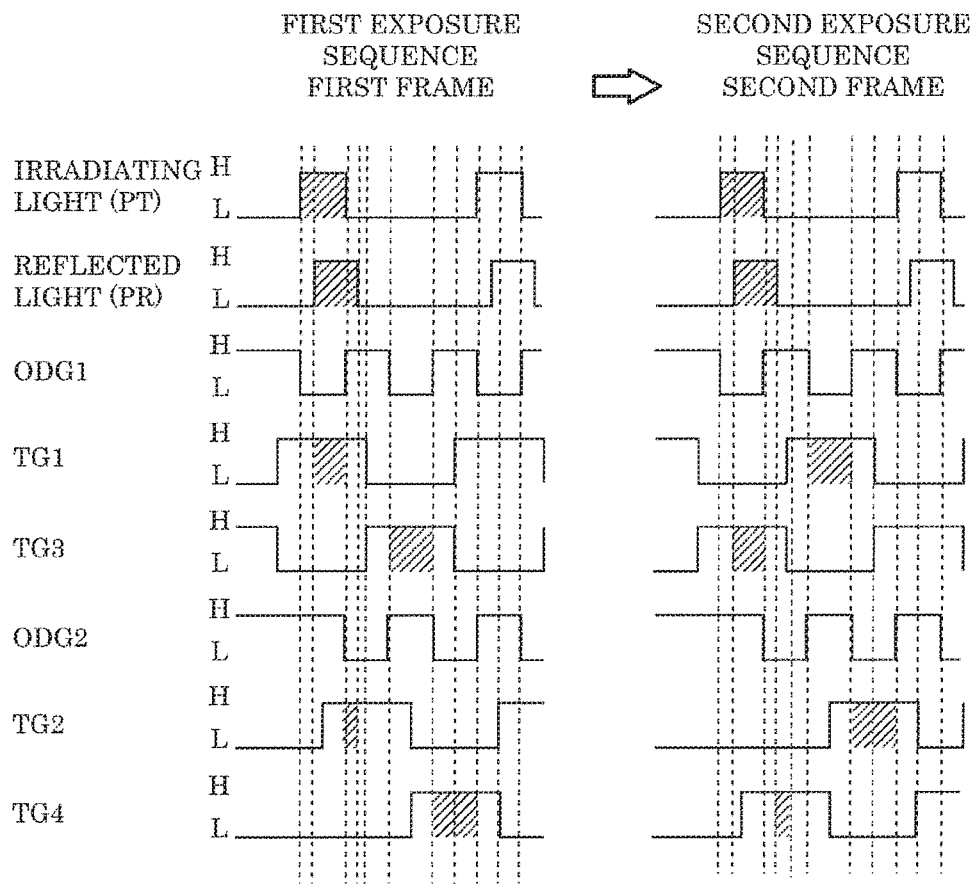
FIG. 25 is a drive timing chart illustrating operations of a solid-state imaging device according to Embodiment 5 during exposure.

FIG. 25 is a drive timing chart illustrating operations of the solid-state imaging device according to Embodiment 5 during exposure. Unlike the driving method illustrated in FIG. 3 according to Embodiment 1, in the present embodiment, as illustrated in FIG. 25, signal charge for one frame is read once after the first exposure sequence, then, after the second exposure sequence is performed, one frame is read, and lastly the same signals for the two frames are added up. Note that the configuration illustrated in FIG. 6 according to Embodiment 1 is assumed as the layout configuration of pixels of the solid-state imaging device according to the present embodiment.

Furthermore, in the second exposure sequence, drive pulse signal TG3 is applied to the gate electrode of reader 12IR3 with the same timing as when drive pulse signal TG1 is applied to the gate electrode of reader 12IR1 in the first exposure sequence, and drive pulse signal TG1 is applied with the same timing as when drive pulse signal TG3 is applied in the first exposure sequence. Moreover, in the second exposure sequence, drive pulse signal TG4 is applied to the gate electrode of reader 12IR4 with the same timing as when drive pulse signal TG2 is applied to the gate electrode of reader 12IR2 in the first exposure sequence, and drive pulse signal TG2 is applied with the same timing as when drive pulse signal TG4 is applied in the first exposure sequence.

In the present embodiment, an embedded channel capacitive coupling element is used as the charge accumulator. However, when the temperature increases, dark current is generated, which may be different in each charge accumulator. Especially when there is a charge accumulator in which dark current is large, the calculation result is affected, and thus dark current components needs to be the same for those that are subtracted from each other in the calculation. With the present driving method, it is possible to solve this problem by interchanging the timing at which drive pulse signal TG for reading is applied in the second exposure sequence.

First, as illustrated in FIG. 25, assume that SD(A) represents the dark current in the first charge accumulator, SD(B) represents the dark current in the third charge accumulator, SD(C) represents the dark current in the second charge accumulator, and SD(D) represents the dark current in the fourth charge accumulator. Here, signals that are accumulated in the respective charge accumulators and read after the first exposure is completed are A0+SD(A), A2+SD(B), A1+SD(C), and A3+SD(D). Next, signals that are accumulated in the respective charge accumulators and read after the second exposure is completed are A2+SD(A), A0+SD(B), A3+SD(C), and A1+SD(D). Adding up these for the same signals for distance calculation results in the following.
(1) The first and third charge accumulators: 2A0+SD(A)+SD(B)
(2) The third and first charge accumulators: 2A2+SD(B)+SD(A)
(3) The second and fourth charge accumulators: 2A1+SD(C)+SD(D)
(4) The fourth and second charge accumulators: 2A3+SD(D)+SD(C)

Either A0 or A2 is a signal having distance information, and one of A0 and A2 is a signal for background light information (BG); the same applies to A1 and 3. A method for calculating a distance using these four signals is as described in Embodiment 1. In the present embodiment, the timing for applying drive pulse signal TG is changed for different frames, and addition thereof allows the dark current in the signal having the distance information and the dark current in the corresponding BG signal to match each other; thus, even when there is a difference in dark current between the charge accumulators in a pixel, these can be cancelled. Furthermore, there are cases where a change in the background light becomes a problem when two frames are used in the PTL of the related art, but in the present implementation, two frames of signals for the background light information or signals including the background light information and the distance information for the same pixel at different times are added, and thus, even when the background light is different across the frames, the former and the latter have the same resultant background light information after the addition, which can be cancelled by subtraction.

Note that, as a method for obtaining the same advantageous effects, light emission can be stopped while the exposure period is kept unchanged in the state where drive pulse signals TG1 to tG4 are fixed at the low level, drive pulses other than TG1 to TG4 and the light emission pulses can be made the same as those in the sequences illustrated in FIG. 3 and FIG. 4, and thus only dark current components in the charge accumulators can be read and subtracted using distance signals so that the dark current components are cancelled. This method has an advantage of allowing a reduction in power consumption because the light source does not emit light, and also allowing the distance measurement accuracy to be maintained also for an object that moves at high speed. Furthermore, although two frames are the background light component which imposes problems with the PTL of the related art is not subtracted, and thus there is no problem even if the background is changed between the frames.

Note that also in the TOF operation with the RGB-IR array described in Embodiment 4, when readers 12IR1 and 12IR3 are arranged side by side on the same side of photoelectric converter 1IR and readers 12IR2 and 12IR4 are arranged side by side, as illustrated in FIG. 19, dark current output can be cancelled by addition of two frames as in the present embodiment.

As described above, with the solid-state imaging device and the method for driving the same according to the embodiment, even if a difference occurs in the output of dark current that is generated in the charge accumulators at high temperature, its effects can be minimized, and thus it is possible to improve the distance measurement accuracy even at high temperature.

OTHER EMBODIMENTS

Although the solid-state imaging device and the method for driving the same according to the present disclosure have been described thus far based on the above embodiments, the solid-state imaging device and the method for driving the same according to the present disclosure are not limited to the embodiments described above. The present disclosure includes other embodiments implemented through a combination of arbitrary structural elements of the above embodiments, or variations obtained through the application of various modifications to the above embodiments that may be conceived by a person having ordinary skill in the art, without departing from the essence of the present disclosure, and various devices such as a distance measurement imaging device in which the solid-state imaging device according to the present disclosure is built-in.

Note that the solid-state imaging device according to the present disclosure obtains distance measurement signals using different pixels. Therefore, errors in distance measurement include (1) a difference in the number of sensitive electrons between pixels that is caused by production tolerance of on-chip lenses, aperture dimension, etc., and (2) a difference in amplifier gain that is caused by a difference in sense capacitance, etc. In this regard, when FD-shared positions are provided within the distance calculation range as illustrated in the checkered layout in FIG. 11A and FIG. 12, the abovementioned (2) can be solved, but the abovementioned (1) remains. This does not stand out in video because of variations in distance measurement that are caused by shot noise, but may become problematic when a shot noise reduction approach is used.

As a solution to this problem, more than one frame is obtained, the effect of shot noise is removed, sensitivity is averaged, and sensitivity ratio $\alpha$ f pixels within the distance calculation range is calculated and brought to a calculation device in advance (calibration is performed). Ideally, if A2>A0 and A3>A1, distance L satisfies $L \propto (A3-A1)/(A2+A3-A0-A1)$, but when the sensitivity ratio between A1 and A3 pixels and A0 and A2 pixels is 1:$\alpha$, $L \propto (A3-A1)/(\alpha A2+A3-\alpha A0-A1)$, which includes an error. Therefore, for example, $\alpha$ may be brought to the calculation process side in advance, and correction may be performed by multiplying 1/α with the A0 and A2 signals before calculation of L.

It goes without saying that there are cases where both the abovementioned (1) and (2) are not problematic because they are dependent on the process and the design technique.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The solid-state imaging device according to the present disclosure is small and enables three-dimensional measurement with high distance measurement accuracy and a wide distance measurement range, and is useful, for example, for three-dimensional measurement of persons, buildings, etc.

What is claimed is:

1. A solid-state imaging device comprising
a plurality of pixels arranged in a matrix on a semiconductor substrate,
wherein each of the plurality of pixels includes:
   a photoelectric converter which receives light from an object and converts the light into charge;
   a plurality of readers which read the charge from the photoelectric converter;
   a plurality of charge accumulators each of which accumulates the charge of the photoelectric converter read by the plurality of readers; and
   a transfer controller which performs a transfer control including controlling whether the charge accumulated in one of the plurality of charge accumulators is transferred by the one of the plurality of charge accumulators serving as a transfer channel for the charge or blocked from being transferred to another one of the plurality of charge accumulators by the one of the plurality of charge accumulators serving as a potential barrier for the charge, and
the transfer controller is disposed between the plurality of charge accumulators.

2. The solid-state imaging device according to claim 1, wherein the charge read to the plurality of charge accumulators is transferred in a vertical direction, and
the charge of the photoelectric converter is read in a direction different from the vertical direction.

3. The solid-state imaging device according to claim 1, wherein the transfer controller has a gate electrode set to a common reference potential.

4. The solid-state imaging device according to claim 1, wherein, in a plan view of the semiconductor substrate, each of the plurality of readers has a gate electrode disposed on an identical side of an outer edge of a light-receiving region of the photoelectric converter.

5. The solid-state imaging device according to claim 1, further comprising
a plurality of exposure controllers which switch between accumulation of the charge into the photoelectric converter and discharge of the charge from the photoelectric converter.

6. The solid-state imaging device according to claim 5, wherein, in a plan view of the semiconductor substrate, each of the plurality of exposure controllers has a gate electrode disposed on a different side of an outer edge of a light-receiving region of the photoelectric converter.

7. The solid-state imaging device according to claim 5, wherein each of the plurality of pixels further includes a light-shielding film which shields at least a portion of a gate electrode of each of the plurality of charge accumulators from light and avoids shielding a gate electrode of each of the plurality of exposure controllers from light.

8. The solid-state imaging device according to claim 5, further comprising
a drive controller which controls driving of a drive pulse signal that is applied to a gate electrode of each of the plurality of exposure controllers and a gate electrode of each of the plurality of readers.

9. The solid-state imaging device according to claim 8, further comprising
a plurality of exposure control gate wires which are provided for each pixel row or each pixel column and through which the drive pulse signal is transmitted to the gate electrode of each of the plurality of exposure controllers,
wherein the plurality of exposure control gate wires are disposed parallel to a short side of an imaging region on the semiconductor substrate, the imaging region being a region in which the plurality of pixels are arranged.

10. The solid-state imaging device according to claim 8, further comprising
a read gate wire through which the drive pulse signal is transmitted to the gate electrode of each of the plurality of readers,
wherein a total number of times the read gate wire switches to a high level is different across a plurality of the read gate wires.

11. The solid-state imaging device according to claim 8, further comprising
an exposure control gate wire through which the drive pulse signal is transmitted from the drive controller to the gate electrode of each of the plurality of exposure controllers,
wherein a total number of times the exposure control gate wire switches to a low level is different across a plurality of the exposure control gate wires.

12. The solid-state imaging device according to claim 8, wherein a direct-current (DC) bias voltage is superimposed on the drive pulse signal.

13. The solid-state imaging device according to claim 1, wherein the plurality of pixels include at least a first pixel and a second pixel which receive infrared light, and
the first pixel and the second pixel share a floating diffusion which converts the charge of the plurality of charge accumulators into a voltage.

14. The solid-state imaging device according to claim 13, wherein driving of a drive pulse signal for a charge accumulator disposed farther away from the floating diffusion among the plurality of charge accumulators that are included the first pixel and driving of a drive pulse signal for a charge accumulator disposed farther away from the floating diffusion among the plurality of charge accumulators that are included the second pixel are controlled with identical timing.

15. The solid-state imaging device according to claim 13, wherein, in a plan view of the semiconductor substrate, the first pixel and the second pixel are arranged in a checkered pattern, and the floating diffusion is arranged in a checkered pattern in the plan view.

16. The solid-state imaging device according to claim 13, wherein, in a plan view of the semiconductor substrate,
the first pixel and the second pixel are arranged in a stripe pattern, and
the floating diffusion is arranged in a stripe pattern in the plan view.

17. The solid-state imaging device according to claim 1, wherein the plurality of pixels include: a fourth pixel which receives visible light; and a third pixel which receives infrared light,
the fourth pixel includes M readers where M is a natural number of 2 or more, and
the third pixel includes N readers where N is a natural number greater than M.

18. The solid-state imaging device according to claim 17, wherein the plurality of charge accumulators included in the fourth pixel accumulate:
the charge read from the third pixel; and the charge read from the fourth pixel.

19. The solid-state imaging device according to claim 17, further comprising
a drive controller which controls driving of a drive pulse signal that is applied to a gate electrode of each of a plurality of exposure controllers and a gate electrode of each of a plurality of readers,
wherein the drive controller implements:
an image drive mode in which a visible image is obtained using the fourth pixel; and a distance measurement drive mode in which the light from the object based on a pulsed beam emitted to the object is converted into the charge using the photoelectric converter of the third pixel, and a signal for distance calculation is obtained using the plurality of charge accumulators of the third pixel and the fourth pixel.

20. The solid-state imaging device according to claim 17, wherein the third pixel and the fourth pixel form a pixel group of four pixels high by four pixels wide, and in a plan view of the semiconductor substrate, the third pixel is arranged in a checkered pattern in the pixel group.

21. The solid-state imaging device according to claim 13, wherein the plurality of charge accumulators and the transfer controller transfer, by serving as the transfer channel, the charge read from the first pixel and the charge read from the second pixel to the floating diffusion.

22. The solid-state imaging device according to claim 13, wherein the plurality of pixels each includes:
an outputter between the floating diffusion and a charge accumulator disposed close to the floating diffusion among the plurality of charge accumulators, and
the plurality of charge accumulators, the transfer controller, and the outputter transfer, by serving as the transfer channel, the charge read from the first pixel and the charge read from the second pixel to the floating diffusion.

* * * * *